United States Patent
Kuk et al.

(10) Patent No.: US 10,201,072 B2
(45) Date of Patent: Feb. 5, 2019

(54) EMI SHIELDING STRUCTURE AND MANUFACTURING METHOD THEREOF

(71) Applicant: SAMSUNG ELECTRONICS CO., LTD., Suwon-si (KR)

(72) Inventors: Keon Kuk, Yongin-si (KR); Il-ju Mun, Suwon-si (KR); Jin-woo Jung, Suwon-si (KR); Ji-woon Yeom, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/489,190

(22) Filed: Apr. 17, 2017

(65) Prior Publication Data

US 2018/0168029 A1    Jun. 14, 2018

(30) Foreign Application Priority Data

Dec. 12, 2016    (KR) .................. 10-2016-0168341

(51) Int. Cl.
*H05K 1/18*    (2006.01)
*H05K 1/02*    (2006.01)
(Continued)

(52) U.S. Cl.
CPC .......... *H05K 1/0218* (2013.01); *B05B 1/00* (2013.01); *H05K 3/284* (2013.01); *H05K 9/0026* (2013.01);
(Continued)

(58) Field of Classification Search
CPC ............ H01K 1/18; H01K 1/218; H01K 1/00; H05K 3/22; H05K 9/00; H05K 3/28;
(Continued)

(56) References Cited

U.S. PATENT DOCUMENTS 5,436,203 A * 7/1995 Lin .................. H01L 23/24
                                                         257/E23.069
5,641,438 A    6/1997 Bunyan et al.
(Continued)

FOREIGN PATENT DOCUMENTS

JP    H06283883 A    10/1994
JP    2001-251088 A   9/2001
(Continued)

OTHER PUBLICATIONS

Hyojun Kim et al., "Onset condition of pulsating cone-jet mode of electrohydrodynamic jetting for plane, hole, and pin type electrodes", Journal of Applied Physics 108, 102804 (2010); American Institute of Physics, doi: 10.1063/1.3511685, URL: http://dx.doi.org/10.1063/1.3511685 (pp. 102804-1-102804-10, Total 11 pages.).
(Continued)

*Primary Examiner* — Xiaoliang Chen
(74) *Attorney, Agent, or Firm* — Sughrue Mion, PLLC

(57) ABSTRACT

An electromagnetic interference (EMI) shielding structure and a manufacturing method thereof are provided. The EMI shielding structure includes a printed circuit board (PCB), a plurality of elements mounted on a region of the PCB, an insulating dam provided on a peripheral portion of the region of the PCB and covering a portion of the plurality of elements; an insulating member provided on a remaining portion of the region the PCB that is surrounded by the insulating dam and covering a remaining portion of the plurality of elements; and a shielding layer covering outer surfaces of the insulating dam and the insulating member.

10 Claims, 30 Drawing Sheets

(51) Int. Cl.
*B05B 1/00* (2006.01)
*H05K 3/28* (2006.01)
*H05K 9/00* (2006.01)

(52) U.S. Cl.
CPC ............... *H05K 2201/0715* (2013.01); *H05K 2201/09909* (2013.01); *H05K 2203/013* (2013.01); *H05K 2203/0126* (2013.01); *H05K 2203/1344* (2013.01)

(58) Field of Classification Search
CPC ......... H01L 21/02; H01L 21/56; H01L 21/78; H01L 23/16; H01L 23/24; H01L 23/28; H01L 23/31
USPC ........... 361/781, 752, 728; 438/113; 174/33, 174/250; 29/841
See application file for complete search history.

(56) References Cited

U.S. PATENT DOCUMENTS

| | | | |
|---|---|---|---|
| 5,650,659 A | 7/1997 | Mostafazadeh et al. | |
| 5,761,053 A | 6/1998 | King et al. | |
| 6,092,281 A * | 7/2000 | Glenn | H01L 23/24 29/841 |
| 6,150,193 A * | 11/2000 | Glenn | H01L 21/56 257/E21.502 |
| 6,263,564 B1 | 7/2001 | Holmberg et al. | |
| 6,297,551 B1 | 10/2001 | Dudderar et al. | |
| 6,466,174 B2 | 10/2002 | Haussler et al. | |
| 6,601,293 B1 * | 8/2003 | Glenn | H01L 23/24 29/841 |
| 6,933,894 B2 | 8/2005 | Ghosh et al. | |
| 6,962,829 B2 * | 11/2005 | Glenn | H01L 21/56 257/E21.502 |
| 7,015,869 B2 | 3/2006 | Marlow et al. | |
| 7,141,869 B2 | 11/2006 | Kim et al. | |
| 7,196,275 B2 | 3/2007 | Babb et al. | |
| 7,311,937 B2 | 12/2007 | Hashimoto | |
| 7,482,686 B2 | 1/2009 | Zhao et al. | |
| 7,633,015 B2 | 12/2009 | Wurzel et al. | |
| 7,752,751 B2 | 7/2010 | Kapusta et al. | |
| 7,981,730 B2 | 7/2011 | Tang et al. | |
| 8,071,893 B2 | 12/2011 | Lin et al. | |
| 8,276,268 B2 | 10/2012 | Kapusta et al. | |
| 8,633,403 B2 | 1/2014 | Lin et al. | |
| 8,881,387 B2 | 11/2014 | Lin et al. | |
| 8,971,553 B2 * | 3/2015 | Takaoka | H01G 7/028 381/175 |
| 9,192,057 B2 | 11/2015 | Malek et al. | |
| 9,572,264 B2 | 2/2017 | Yamamoto et al. | |
| 9,768,154 B2 * | 9/2017 | Tomonari | H01L 25/50 |
| 2001/0033478 A1 | 10/2001 | Ortiz et al. | |
| 2004/0087043 A1 | 5/2004 | Lee et al. | |
| 2004/0231872 A1 | 11/2004 | Arnold et al. | |
| 2005/0045358 A1 | 3/2005 | Arnold | |
| 2005/0280139 A1 | 12/2005 | Zhao et al. | |
| 2007/0030661 A1 | 2/2007 | Morris et al. | |
| 2007/0176281 A1 | 8/2007 | Kim et al. | |
| 2007/0187136 A1 * | 8/2007 | Higashiguchi | H01L 23/24 174/250 |
| 2007/0230131 A1 | 10/2007 | Bunyan et al. | |
| 2008/0044744 A1 * | 2/2008 | Yamazaki | H01L 27/1288 430/5 |
| 2008/0292846 A1 | 11/2008 | Muranaga | |
| 2009/0244878 A1 | 10/2009 | Wurzel et al. | |
| 2010/0188292 A1 | 7/2010 | Rutfors | |
| 2010/0230789 A1 | 9/2010 | Yorita et al. | |
| 2010/0327431 A1 | 12/2010 | Touzelbaev et al. | |
| 2011/0006106 A1 | 1/2011 | Kanryo et al. | |
| 2012/0023743 A1 | 2/2012 | Lin et al. | |
| 2012/0104571 A1 * | 5/2012 | Yoo | H01L 23/552 257/659 |
| 2012/0218727 A1 | 8/2012 | Kim | |
| 2012/0320558 A1 | 12/2012 | Foster et al. | |
| 2013/0083501 A1 | 4/2013 | Azzopardi et al. | |
| 2013/0114228 A1 | 5/2013 | Merz et al. | |
| 2013/0241039 A1 | 9/2013 | Choi et al. | |
| 2013/0286609 A1 | 10/2013 | Merz | |
| 2014/0002310 A1 | 1/2014 | Kim | |
| 2014/0126157 A1 * | 5/2014 | Sawatari | H01L 23/552 361/728 |
| 2014/0160699 A1 * | 6/2014 | Zhang | H01L 23/552 361/752 |
| 2014/0198459 A1 | 7/2014 | Cheng | |
| 2014/0271961 A1 | 9/2014 | Khoshnevis | |
| 2015/0016066 A1 * | 1/2015 | Shimamura | H01L 23/3121 361/728 |
| 2015/0022978 A1 | 1/2015 | Steuer et al. | |
| 2015/0022986 A1 | 1/2015 | Steuer et al. | |
| 2015/0036297 A1 * | 2/2015 | Chen | H01L 23/49805 361/748 |
| 2015/0043189 A1 * | 2/2015 | Kitazaki | H01L 23/3121 361/816 |
| 2015/0070851 A1 * | 3/2015 | Kitazaki | H05K 3/301 361/729 |
| 2015/0206852 A1 | 7/2015 | Lin et al. | |
| 2015/0214602 A1 | 7/2015 | Hobson et al. | |
| 2016/0091575 A1 | 3/2016 | Yamada et al. | |
| 2016/0157392 A1 | 6/2016 | Happoya | |
| 2016/0262292 A1 * | 9/2016 | Kuk | H01L 23/24 |
| 2017/0117615 A1 | 4/2017 | Choon et al. | |
| 2017/0251549 A1 | 8/2017 | Lee et al. | |
| 2017/0295679 A1 | 10/2017 | Kim et al. | |
| 2017/0325365 A1 | 11/2017 | Kuk et al. | |
| 2018/0116078 A1 | 4/2018 | Mun et al. | |

FOREIGN PATENT DOCUMENTS

| | | |
|---|---|---|
| JP | 2004048762 A | 2/2004 |
| JP | 2011124598 A | 6/2011 |
| JP | 2011-146779 A | 7/2011 |
| JP | 2015-65343 A | 4/2015 |
| JP | 2016-111026 A | 6/2016 |
| KR | 10-0321429 B1 | 3/2002 |
| KR | 10-2006-0083770 A | 7/2006 |
| KR | 100618085 B1 | 8/2006 |
| KR | 100742098 B1 | 7/2007 |
| KR | 10-2010-0064008 A | 6/2010 |
| KR | 10-2012-0127852 A | 11/2012 |
| KR | 10-2014-0111739 A | 9/2014 |
| KR | 20140132880 A | 11/2014 |
| KR | 10-1579623 B1 | 12/2015 |
| KR | 10-2016-0031572 A | 3/2016 |
| KR | 10-2016-0044953 A | 4/2016 |
| KR | 20160045336 A | 4/2016 |
| KR | 10-2016-0108117 A | 9/2016 |
| KR | 10-2017-0125690 A | 11/2017 |
| KR | 20180087551 A | 8/2018 |
| KR | 10-2018-0101831 A | 9/2018 |
| WO | 2004047510 A2 | 6/2004 |
| WO | 2005029937 A1 | 3/2005 |
| WO | 2016144039 A1 | 9/2016 |
| WO | 2017111956 A1 | 6/2017 |
| WO | 2017191888 A1 | 11/2017 |

OTHER PUBLICATIONS

Oh-Hyun Baek et al., "3D Printing Process for Mass Production of PCB Component", Samsung, Best Paper Award 2015, Total 7 pages.
International Search Report (PCT/ISA/210) dated Jun. 27, 2016, issued by the International Searching Authority in counterpart International Application No. PCT/KR2016/002111.
Written Opinion (PCT/ISA/237) dated Jun. 27, 2016, issued by the International Searching Authority in counterpart International Application No. PCT/KR2016/002111.
International Search Report dated Apr. 20, 2017 issued by the International Searching Authority in counterpart International Application No. PCT/KR2017/001370 (PCT/ISA/210).

(56) References Cited

OTHER PUBLICATIONS

Written Opinion dated Apr. 20, 2017 issued by the International Searching Authority in counterpart International Application No. PCT/KR2017/001370 (PCT/ISA/237).
Office Action dated Dec. 13, 2017 by the United States Patent and Trademark Office in U.S. Appl. No. 15/061,233.
Office Action dated Jan. 11, 2018 by United States Patent and Trademark Office in U.S. Appl. No. 15/386,823.
Communication dated Feb. 21, 2018, from the European Patent Office in counterpart European Application No. 16761926.1.
Office Action dated Jun. 29, 2018, issued by the U.S. Patent and Trademark Office in U.S. Appl. No. 15/061,233.
Office Action dated Aug. 9, 2018, issued by the U.S. Patent and Trademark Office in U.S. Appl. No. 15/386,823.
Communication dated May 25, 2018, issued by the European Patent Office in counterpart European Application No. 16761926.1.
International Search Report (PCT/ISA/210) dated Oct. 22, 2018 issued by the International Searching Authority in International Application No. PCT/KR2018/007746.
Written Opinion (PCT/ISA/237) dated Oct. 22, 2018 issued by the International Searching Authority in International Application No. PCT/KR2018/007746.
International Search Report (PCT/ISA/210) dated Dec. 17, 2018 issued by the International Searching Authority in International Application No. PCT/KR2018/010501.
Written Opinion (PCT/ISA/237) dated Dec. 17, 2018, issued by the International Searching Authority in International Application No. PCT/KR2018/010501.
Notice of Allowance dated Oct. 30, 2018, issued by the United States Patent and Trademark Office in U.S. Appl. No. 15/386,823.
Office Action dated Nov. 29, 2018 issued the United States Patent and Trademark Office in U.S. Appl. No. 15/061,233.
Office Action dated Nov. 8, 2018 issued the United States Patent and Trademark Office in U.S. Appl. No. 15/488,024.

* cited by examiner

EMI SHIELDING STRUCTURE AND MANUFACTURING METHOD THEREOF

CROSS-REFERENCE TO RELATED APPLICATIONS

This application claims priority from Korean Patent Application No. 10-2016-0168341, filed on Dec. 12, 2016, in the Korean Intellectual Property Office, the disclosure of which is incorporated herein by reference in its entirety.

BACKGROUND

Field

Apparatuses and methods consistent with exemplary embodiments relate to electromagnetic interference (EMI) shielding, and more particularly, to an EMI shielding structure capable of protecting a semiconductor chip, a passive element, and the like included in a package from external environments and simultaneously shielding EMI and a manufacturing method of the EMI shielding structure.

Description of the Related Art

In recent years, demands on portable apparatuses have been rapidly increased in electronic product markets and thus miniaturization and weight lightening of the portable apparatuses are increasingly needed to facilitate portability. Technology for reducing individual sizes of electronic components provided in the portable apparatuses and semiconductor package technology for integrating a plurality of circuit elements mounted on a printed circuit board (PCB) into one package are needed to realize miniaturization and weight reduction of the portable apparatuses. For example, the semiconductor packages which handle a radio frequency (RF) signal need to be miniaturized as well as to include various EMI shielding structures to realize good EMI shielding or EMI immunity characteristics.

A related art EMI shielding structure may include a shield that is formed of a press-processed metallic material and covers circuits elements mounted on a PCB.

In the case of neighboring shielding regions being shielded by covering the shielding regions with a shield can, one shield can may be used for each shielding region. The shield cans may be mounted on a PCB at a fixed interval and side portions of neighboring shield cans may be spaced apart from each other by the fixed interval. The interval is a distance required to fix the shield cans to the PCB. Accordingly, a region on which circuit elements are to be mounted may be reduced by the distance required to install the neighboring shield cans in the PCB. Accordingly, the EMI shielding structure employing the shield can in the related art may cause a high integration ratio of the circuit elements to be degraded.

Separate press processing has to be performed to manufacture the shield can in the related art EMI shielding structure and a material for a shield can may be expensive and thus product cost may be increased.

SUMMARY

Exemplary embodiments may overcome the above disadvantages and other disadvantages not described above. Also, an exemplary embodiment is not required to overcome the disadvantages described above, and an exemplary embodiment may not overcome any of the problems described above.

Exemplary embodiments provide an EMI shielding structure suitable for a high integrated circuit and a manufacturing method thereof.

According to an aspect of an exemplary embodiment, there is provided an EMI shielding structure including a printed circuit board (PCB), a plurality of elements mounted on a region of the PCB, an insulating dam provided on a peripheral portion of the region of the PCB and covering a portion of the plurality of elements; an insulating member provided on a remaining portion of the region the PCB that is surrounded by the insulating dam and covering a remaining portion of the plurality of elements; and a shielding layer covering outer surfaces of the insulating dam and the insulating member.

An outer side surface of the insulating dam may be inclined. An outer side surface of the insulating dam may be stepped. An upper corner portion of the insulating dam may be rounded.

The insulating dam may have a width that gradually increases from an upper end toward a lower end. A top surface of the insulating dam may be smooth. A top surface of the insulating member may be coplanar with the top surface of the insulating dam.

The shielding layer may be formed of an electroconductive material sprayed in an atomizing form and have a predetermined thickness. A portion of the shielding layer may be formed of a shielding film. The shielding layer may include a first portion covering an outer side surface of the insulating dam and a portion of a top surface of the insulating dam and a second portion covering a remaining portion of the top surface of the insulating dam and a top surface of the insulating member.

The first portion of the shielding layer may be in contact with or may overlap the second portion of the shielding layer.

An interval between the elements mounted on the PCB may be 0.8 mm.

According to an aspect of another exemplary embodiment, there is provided a method of manufacturing an electromagnetic interference (EMI) shielding structure, the method including forming an insulating dam along peripheral portion of a region of a printed circuit board (PCB) on which a plurality of elements are mounted, the insulating dam covering a portion of the plurality of elements; forming an insulating member on a remaining portion of the region the PCB that is surrounded by the insulating dam, the insulating member covering a remaining portion of the plurality of elements; and forming a shielding layer by covering sides surface and a top surface of the insulating dam and a top surface of the insulating member with an electroconductive material.

The forming of the shielding layer may include forming the shielding layer to a preset thickness by discharging the electroconductive material in an atomizing form or a fine droplet form.

The forming of the shielding layer may include forming a first portion covering the side surface and a portion of the top surface of the insulating dam and forming a second portion covering a remaining portion of the top surface of the insulating dam and the top surface of the insulating member.

A viscosity of a material forming the insulating dam may be different from that of a material forming the insulating member.

The viscosity of the material forming the insulating dam may be larger than that of the material forming the insulating member. The viscosity of the material forming the insulating dam may be in a range of 20,000 cps to 5,000,000 cps and the viscosity of the material forming the insulating member may be in a range of 100 cps to 30,000 cps.

The insulating dam and the insulating member may be formed a thixotropic material or a phase-change (for example, thermoplastic or thermosetting) material having fluidity. The thixotropic material may include at least one selected from the group consisting of synthetic fine silica powder, bentonite, surface-treated calcium carbonate particles, hydrogenated castor oil, metal soaps, aluminum stearate, polyamide wax, oxidized polyethylenes, and polymerized linseed oil. The phase-change material may include at least one selected from the group consisting of polyurethane, polyurea, polyvinyl chloride, polystyrene, acrylonitrile butadiene styrene (ABS), polyamide, acrylic, epoxy, silicone, and polybutylene terephthalate (PBTP).

A viscosity of a material for the shielding layer may be in a range of 1,000 cps to 100,000 cps.

BRIEF DESCRIPTION OF THE DRAWING FIGURES

The above and/or other aspects will be more apparent by describing certain exemplary embodiments with reference to the accompanying drawings, in which.

DETAILED DESCRIPTION OF EXEMPLARY EMBODIMENTS

Figure 1:
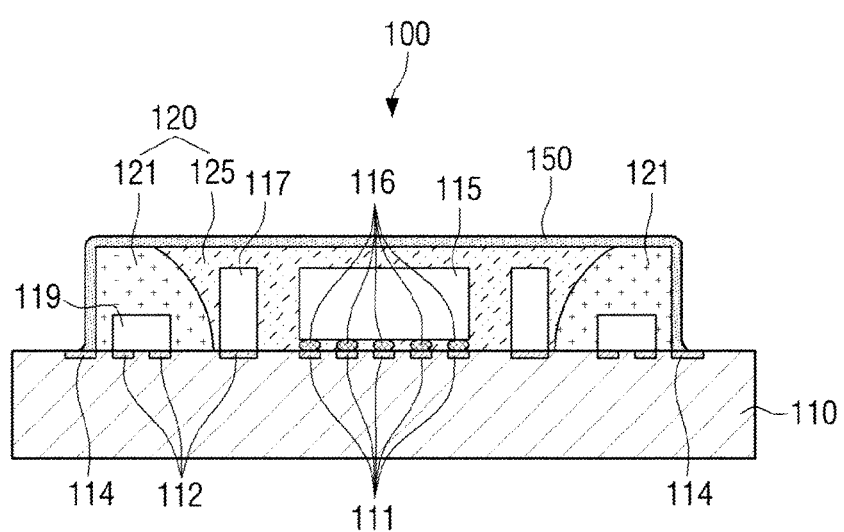
FIG. 1 is a cross-sectional diagram illustrating an EMI shielding structure according to an exemplary embodiment.

Various exemplary embodiments will now be described more fully with reference to the accompanying drawings. The inventive concept may, however, be embodied in different forms and should not be construed as limited to the embodiments set forth herein. Rather, these embodiments are provided so that this disclosure is thorough and complete and fully conveys the scope of the inventive concept to one skilled in the art. In the drawings, the sizes and relative sizes of layers and regions may be exaggerated for clarity. Like numbers refer to like elements throughout.

It will be understood that when an element is referred to as being "on" or "in contact with" another element, it can be directly on or in direct contact with the other element or intervening elements may be present. In contrast, when an element is referred to as being "directly on" or "in direct contact with" another element, there are no intervening elements present. Other words used to describe the relationship between elements should be interpreted in a like fashion (e.g., "between" versus "directly between," "adjacent" versus "directly adjacent," etc.).

It will be understood that, although the terms first, second, etc. may be used herein in reference to elements of the embodiments regardless of an order and/or importance, such elements should not be construed as limited by these terms. The terms are used only to distinguish one element from other elements. For example, without departing from the spirit of the inventive concept, a first element may refer to a second element, and similarly, the second element may refer to the first element.

As used herein, the singular forms "a," "an" and "the" are intended to include the plural forms as well, unless the context clearly indicates otherwise. It will be further understood that the terms "comprises," "comprising," "includes" and "including" when used in this specification, specify the presence of stated features, integers, steps, operations, elements, components, and/or groups thereof, but do not preclude the presence or addition of one or more other features, integers, steps, operations, elements, components, and/or groups thereof.

The terminology used herein is for the purpose of describing particular embodiments only and is not intended to limit the inventive concept. Unless otherwise defined, all terms (including technical and scientific terms) used herein have the same meaning as commonly understood by one of ordinary skill in the art to which this inventive concept belongs.

An EMI shielding structure according to exemplary embodiments may be applied to a smart phone, a display apparatus, a wearable device, and the like.

It will be described in the exemplary embodiments that the EMI shielding structures shield a plurality of circuit elements, but embodiments are not limited thereto and the EMI shielding structure may be formed to shield only single circuit element.

A method of manufacturing an EMI shielding structure according to exemplary embodiments may include forming an insulating structure through a two-stage process. For example, the forming of the insulating structure may include a first-stage process for forming an insulating dam along an outer circumference of a shielding region and a second-stage process for forming an insulating member by injecting an insulating material having a viscosity in the inner side of the insulating dam. When the insulating structure being formed through the two-stage process, the insulating material for the insulating dam may have the viscosity that the insulating material may not roll down after the insulating material discharges from a nozzle and the shape of the insulating dam is substantially maintained as it as. The insulating member may have the viscosity lower than that of the insulating material for the insulating dam and thus may have fluidity so that the insulating member may be filled within a space surrounded by the insulating dam.

The nozzle for forming the insulating dam may include a side guide part and a top guide part configured to guide a discharge direction of the insulating material discharged from a discharge hole from one side and an upper side of the discharge hole. The side guide part may guide the insulating material to be discharged toward the inner side of the shielding region. The top guide part may guide the insulating material to be discharged toward a printed circuit board (PCB) and simultaneously allow the top surface of the insulating dam to be flattened. As the top surface of the insulating dam is formed smoothly, the top surface of the insulating member which is injected into the space surrounded with the insulating dam may be formed to be substantially coplanar with the top surface of the insulating dam. When the top surface of the insulating dam and the top surface of the insulating member are formed to be substantially coplanar without a step, a shielding layer covering the outer surface of the insulating structure may also be formed smoothly in a subsequent process.

In the EMI shielding structure according to exemplary embodiments, the shielding layer having a thin thickness may be formed by coating a shielding material having electric conductivity to the outer surface of the insulating structure configured of the insulating dam and the insulating member. The shielding layer may be formed through a single process which covers the entire outer surface of the insulating structure by spraying the shielding material in an atomizing form.

The shielding layer may be formed through an electrohydrodynamic (EHD) inkjet printing method. The shielding material may be discharged from a nozzle in a fine droplet form and may be dropped onto the insulating structure. Accordingly, the shielding material may cover the insulating structure. For example, the shielding layer may be formed by discharging the shielding material in different modes with respect to the side surface and the top surface of the insulating structure using one nozzle. In this example, the shielding layer formed in the side surface of the insulating structure may be formed through a low-speed precise prototyping mode (for example, cone-jet mode, tilting-jet mode, and the like) and the shielding layer formed in the top surface of the insulating structure may be formed through a rapid prototyping mode (for example, jetting mode, spraying mode, and the like) which is carried out at high speed as compared with the precise prototyping mode. The precise prototyping and the rapid prototyping may be accomplished through control of a discharge method and a discharge amount of the shielding material discharged through the same nozzle.

Hereinafter, EMI shielding structures and manufacturing methods thereof according to an exemplary embodiment will be described in detail with reference to the accompanying drawings.

FIG. 1 is a cross-sectional diagram illustrating an EMI shielding structure according to an exemplary embodiment.

Referring to FIG. 1, an EMI shielding structure 100 may include a printed circuit board (PCB) 110 and a plurality of circuit elements 115, 117, and 119 mounted on the PCB 110. The plurality of circuit elements may be different types of circuit elements, for example, an integrated circuit (IC) chip, a passive element, and different types of components. For example, the IC chip may be an application processor (AP), a memory, a radio frequency (RF) chip, and the like and the passive element may be a resistor, a condenser, a coil, and the like. The different types of components may be a connector, a card socket, an EMI shielding component, and the like.

A ground pad 114 may be patterned on the PCB 110. For example, the ground pad 114 may be formed in the PCB 110 so that it does not protrude from an upper surface of the PCB 110 and the top surface of the ground pad 114 is exposed. In this example, the ground pad 114 may be integrally formed with a ground layer formed in the inside of the PCB 110.

A lower end of a shielding layer 150 covering the entire outer surface of the insulating structure 120 may be grounded to the ground pad 114. Ground terminals of the plurality of circuit elements 115, 117, and 119 may be grounded to the ground pad 114.

The circuit element 115 may include a plurality of connection terminals 116 electrically coupled to first connection pads 111 of the PCB 110. The plurality of connection terminals 116 may be formed in a ball grid array (BGA) manner such as a solder ball. However, formation of the connection terminal 116 is not limited to the BGA manner and the connection terminal 116 may be formed in various manners according to a lead type of the circuit element 115, for example, quad flat no lead (QFN), plastic leaded chip carrier (PLCC), quad flat package (QFP), small outline package (SOP), and thin/shrink/thin shrink SOP (TSOP/SSOP/TSSOP).

The remaining circuit elements 117 and 119 may include at least one connection terminal electrically coupled to second connection pads 112 of the PCB 110. The circuit elements 117 and 119 may have a height smaller than or larger than that of the circuit element 115 when the circuit elements 115, 117, and 119 are mounted on the PCB 110. The circuit elements 115, 117, and 119 may be designed to be spaced at a narrow interval, for example, 0.8 mm or less.

Referring to FIG. 1, the EMI shielding structure 100 according to an exemplary embodiment may include an insulating structure 120 which covers the plurality of circuit elements 115, 117, and 119 and the shielding layer 150 which covers a side surface and a top surface of the insulating structure 120.

The insulating structure 120 may include an insulating dam 121 formed along an outer circumference of a shielding region preset on the PCB 110 and an insulating member 125 formed in a space surrounded with the insulating dam 121. The outer periphery of the shielding region may coincide with a periphery of the insulating dam 121 illustrated in FIG. 7 or may be located in an inner side of the outer circumference of the insulating dam 121 of FIG. 7.

The insulating dam 121 may be formed through a first nozzle (see 216 of FIG. 3) provided in a material discharge device 200. An insulating material discharged from the first nozzle 216 may provide electric insulation and have a fixed viscosity. The viscosity of the insulating material for the insulating dam 121 may be in a range of 20,000 cps to 5,000,000 cps sufficient to maintain a fixed dam shape after the insulating material is discharged from the first nozzle 216.

The insulating member 125 may be formed through a second nozzle (see 217 of FIG. 3) provided in the material discharge device 200. An insulating material for the insulating member 125 may have the same material property as the insulating material for the insulating dam 121. However, the insulating material for the insulating member 125 may be filled within the space, which corresponds to a portion of the shielding region in which the insulating dam 121 is not formed, surrounded with the insulating dam 121 and thus the insulating material for the insulating member 125 may have a fluidity larger than that of the insulating material for the insulating dam 121. Accordingly, the viscosity of the insulating material for the insulating member 125 may be in a range of 100 cps to 30,000 cps.

The materials for the insulating dam 121 and the insulating member 125 may include a thixotropic material having fluidity or a phase-change (for example, thermoplastic or thermosetting) material having fluidity.

The thixotropic material may include at least one selected from the group consisting of synthetic fine silica powder, bentonite, surface-treated calcium carbonate particles, hydrogenated castor oil, metal soaps, aluminum stearate, polyamide wax, oxidized polyethylenes, and polymerized linseed oil. For example. the metal soaps may include aluminum stearate.

The phase-change material may include at least one selected from the group consisting of polyurethane, polyurea, polyvinyl chloride, polystyrene, acrylonitrile butadiene styrene (ABS), polyamide, acrylic, epoxy, silicone, and polybutylene terephthalate (PBTP).

The shielding layer 150 may be formed to cover an entire outer surface of the insulating structure 120 by spraying a shielding material in an atomizing form through a third nozzle (see 218 of FIG. 9) of a separate material spray device. The shielding layer 150 may cover the ground pattern 114 so that a portion of the shielding layer 150 may be grounded to the ground pattern 114.

The shielding layer 150 may be formed of an electroconductive material. The electroconductive material may contain an electroconductive filter and a binder resin.

The electroconductive filler may include a metal such as Ag, Cu, Ni, Al, or Sn or may include a conductive carbon such as carbon black, carbon nanotube (CNT), or graphite. The electroconductive filler may include a metal-coated material such as Ag/Cu, Ag/glass fiber, or Ni/graphite or may include a conductive polymer material such as polypyrrole or polyaniline. The electroconductive filler may be configured in any one of a flake type, a spherical type, a rod type, and a dendrite type or a combination thereof.

The binder resin may include a silicon resin, an epoxy resin, a urethane resin, an alkyd resin, and the like. The material for the shielding layer 150 may further contain additives for improving other performance (for example, a viscosity agent, an antioxidant, a high-molecular surfactant, and the like) and a solvent (for example, water, alcohol, and the like).

Hereinafter, a manufacturing process of the EMI shielding structure 100 according to an exemplary embodiment will be sequentially described with reference to FIGS. 2A to 2D. FIGS. 2A to 2D are diagrams sequentially illustrating a manufacturing process of an EMI shielding structure according to an exemplary embodiment.

Figure 2A:
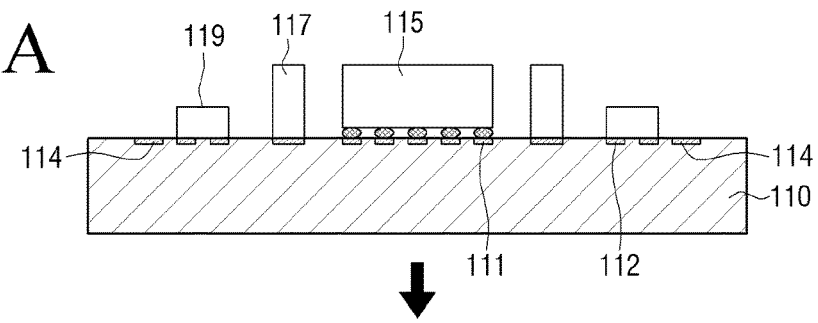
FIGS. 2A, 2B, 2C and 2D are diagrams sequentially illustrating a manufacturing process of an EMI shielding structure according to an embodiment.

First, as illustrated in FIG. 2A, the PCB 110 on which the plurality of circuit elements 115, 117, and 119 are mounted may be disposed in a working position.

For example, the insulating structure 120 may be first formed in the shielding region preset in the PCB 110 in a state that the PCB 110 is disposed in the working position and then the shielding layer 150 may be formed. The insulating structure 120 may include the insulating dam 121 and the insulating member 125. In this example, the insulating dam 121 may be first formed and then the insulating member 15 may be formed.

Figure 2B:
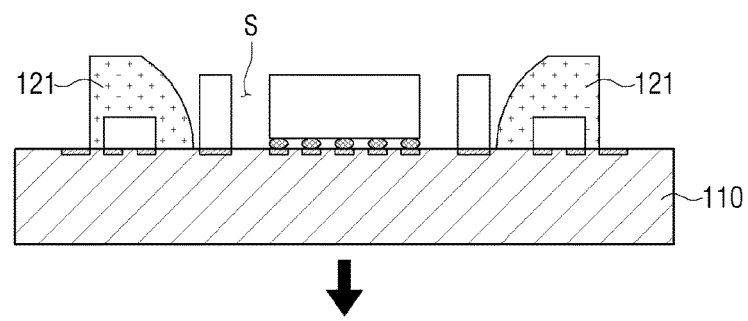

As illustrated in FIG. 2B, while the first nozzle 216 moves along a preset nozzle moving route (see FIG. 4) so that the first nozzle 216 moves along the outer periphery of the shielding region, the first nozzle 216 may discharge an insulating material and thus the insulating dam 121 may be formed. The insulating material may have a high viscosity in a range of 20,000 cps to 5,000,000 cps and thus a fixed dam shape in the insulating dam 121 may be maintained after the insulating material is discharged from the first nozzle 216. The insulating dam 121 may cover a plurality of circuit elements close to the outer periphery of the shielding region.

Figure 2C:
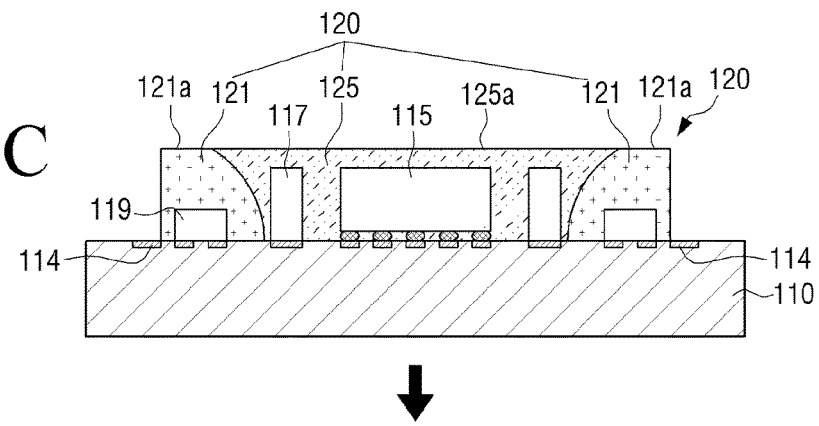
Figure 2D:
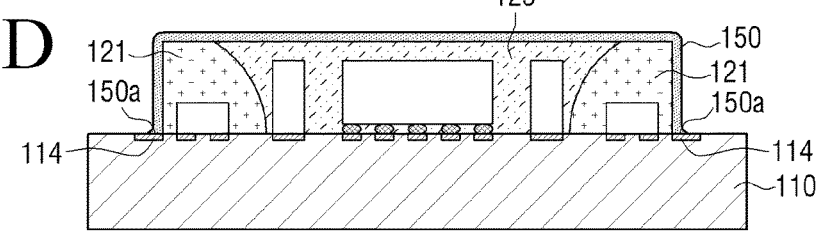
Figure 7:
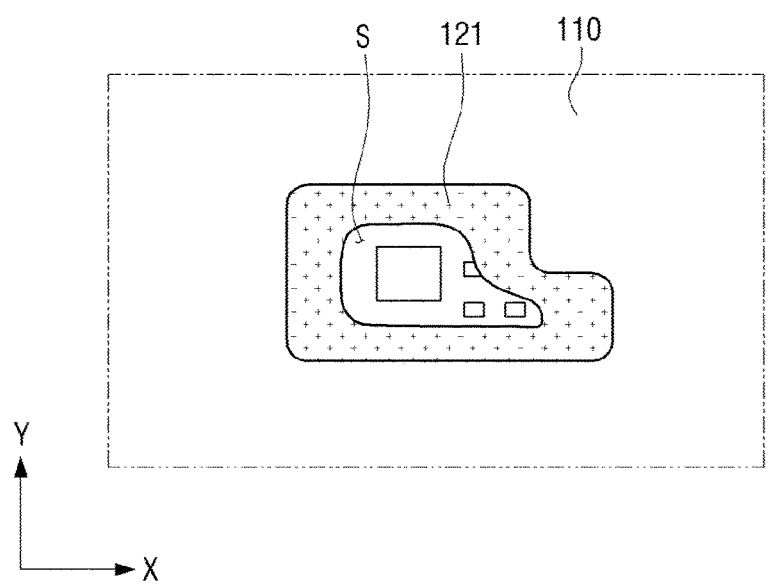
FIG. 7 is a plan view illustrating an insulating dam formed in a shielding region according to an exemplary embodiment.
Figure 8:
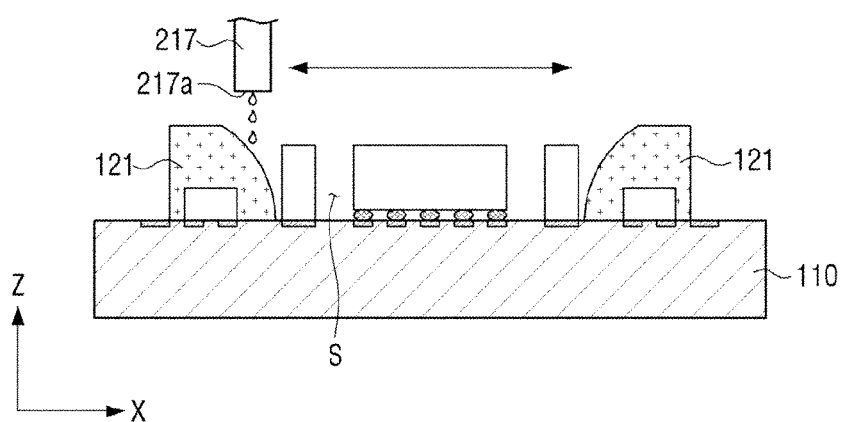
FIG. 8 is a diagram illustrating an example of forming an insulating member in a space surrounded with an insulating dam through a second nozzle of a material discharge device according to an exemplary embodiment.

After the insulating dam 121 is formed, an insulating material may be injected into a space (see S of FIG. 7) surrounded with the insulating dam 121 by moving the second nozzle 217 (see FIG. 8). Accordingly, as illustrated in FIG. 2C, the insulating member 125 may be formed in the remaining portion of the shielding region that is not occupied with the insulating dam 121. The insulating material for the insulating member 125 may have the same material property as the insulating material for the insulating dam 121. However, the insulating material for the insulating member 125 may have a viscosity smaller than that of the insulating material for the insulating dam 121, for example, in a range of 100 cps to 30,000 cps and thus the insulating material for the insulating member 125 may have a fluidity larger than that of the insulating material for the insulating dam 121. A top surface 125a of the insulating member 125 may be substantially coplanar with a top surface 121a of the insulating dam 121 by controlling a discharge amount of the insulating material discharged through the second nozzle 217. The top surface 121a of the insulating dam 121 may be formed to be substantially flattened through a top guide part 216e of the first nozzle 216 when the insulating material is discharged from the first nozzle 216. Accordingly, the shielding layer 150 which covers a top portion of the insulating structure 120 may be manufactured to be substantially flat as illustrated in FIG. 2D in a process of forming the shielding layer 150.

The insulating dam 121 and the insulating member 125 formed of the insulating materials having the same material property may be formed sequentially and thus a boundary surface between the insulating dam 121 and the insulating member 125 may be formed.

Figure 9:
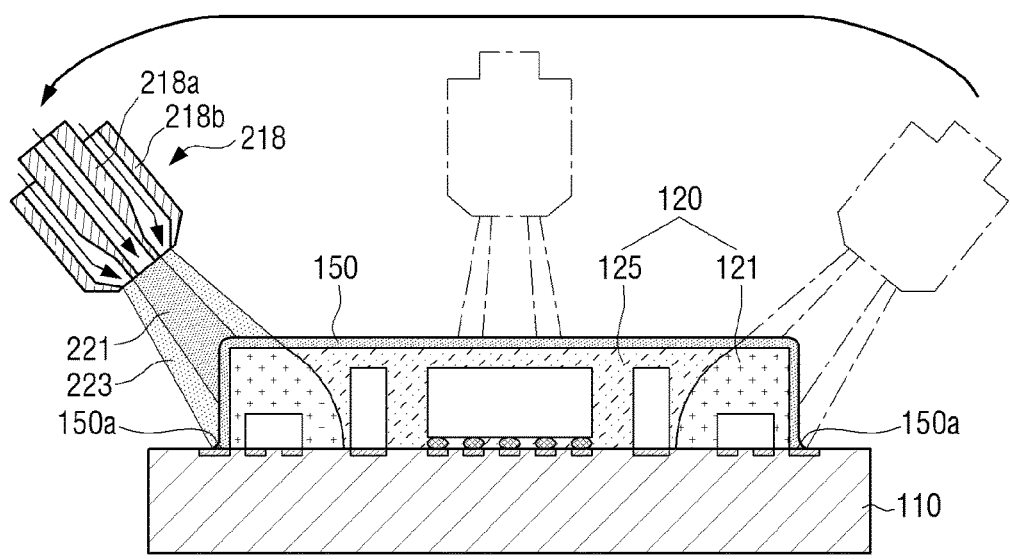
FIG. 9 is a diagram illustrating an example of forming a shielding layer in a state that an insulating dam and an insulating member are formed according to an exemplary embodiment.

After the insulating structure 120 is formed, the third nozzle 218 may move while simultaneously discharging a shielding material substantially in an atomizing form toward the insulating structure 120 (see FIG. 9). Accordingly, the shielding layer 150 may be formed to a fixed or uniform thickness on an entire outer surface of the insulating structure 120.

When the shielding material is sprayed toward the side portion of the insulating dam 121 through the third nozzle 218, an angle of the third nozzle 218 may be appropriately controlled so that the shielding layer 150 may cover the ground pad 114 and a lower end portion 150a of the shielding 150 may be electrically coupled to the ground pad 114.

According to the above-described process for manufacturing the EMI shielding structure 100 according to an exemplary embodiment, the circuit elements may not interfere with a side guide part 216b of the first nozzle 216 while the first nozzle 216 moves along a nozzle moving route and the third nozzle 218 for forming the shielding layer 150 may not move between the circuit elements. Accordingly, the EMI shielding structure 100 may be easily manufactured in the PCB 110 on which the circuit elements are mounted to be spaced at a narrow interval, for example, 0.8 mm or less.

Hereinafter, devices for manufacturing the EMI shielding structure 100 according to an exemplary embodiment will be described with reference to FIGS. 3 to 9.

Figure 3:
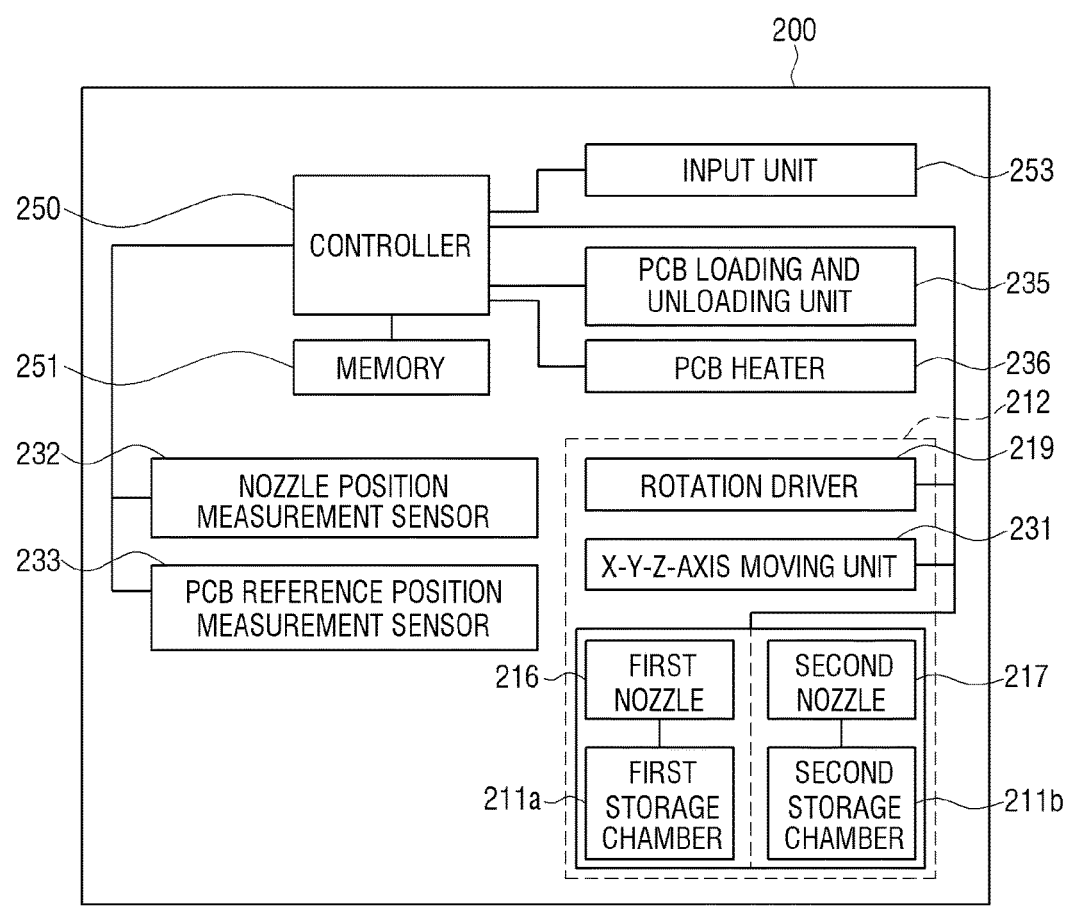
FIG. 3 is a block diagram illustrating a material discharge device for forming an insulating dam according to an exemplary embodiment.

FIG. 3 is a block diagram illustrating a material discharge device for forming an insulating dam according to an exemplary embodiment.

The device discharge device 200 may include a dispenser 212 configured to discharge a fixed amount of insulating material. The dispenser 212 may include first and second storage chambers 211a and 211b configured to store insulating materials and the first and second nozzles 216 and 217 configured to discharge the insulating materials provided from the storage chambers 211a and 211b, respectively.

The dispenser 212 may include an X-Y-Z-axis moving unit 231 configured to move the first nozzle 216 in X-axis, Y-axis, and Y-axis directions and a rotation driver 219 configured to rotate the first nozzle 216 in a clockwise direction or a counterclockwise direction or to stop rotation of the first nozzle 216. The X-Y-Z-axis moving unit 231 may include a plurality of step motors configured to move the first nozzle 216 in the X-axis, Y-axis, and Z-axis directions. The plurality of step motors may be coupled to a nozzle mounting unit on which the first nozzle 216 is mounted to transfer driving forces to the first nozzle 216. The rotation driver 219 may include a motor configured to provide rotation power and an encoder configured to control a rotation angle of the first nozzle 216 by detecting the number of rotations of the motor. The X-Y-Z-axis moving unit 231 and the rotation driver 219 may be electrically coupled to a controller 250 and may be controlled through the controller 250.

After the insulating dam 121 is formed by discharge of the insulating material by the first nozzle 216 while the first nozzle 216 is moved the X-Y-Z-axis moving unit 231, the second nozzle 217 may discharge the insulating material to the space S surrounded with the insulating dam 121 while moving over the space S.

A discharge hole of the first nozzle 216 may often be cleaned or newly replaced in the material discharge device 200 or an end portion of the first nozzle 216 which discharges the insulating material may not often be accurately aligned with a preset setup position in the material discharge device 200. Accordingly, the material discharge device 200 may include a nozzle position measurement sensor 232 which allows the first nozzle 216 to be set to the setup position.

The nozzle position measurement sensor 232 may include a imaging camera and may be disposed below the first nozzle 216 at a fixed interval. The calibration of the first nozzle 216 may be performed. For example, an end portion of the first nozzle 216 is aligned with a nozzle origin by reading the end position of the first nozzle 216 through an image obtained through the nozzle position measurement sensor 232, comparing the read end position with the nozzle origin value pre-stored in a memory 251, and moving the first nozzle 216 by X and Y values according to a comparison difference. In this example, the movement of the first nozzle 216 may be performed through the movement of a nozzle mounting unit according to the driving of the X-Y-Z-axis moving unit 231.

The material discharge device 200 may set a start point (see Ap of FIG. 4) of the first nozzle 216 for material discharge by detecting a posture of the PCB in an X-Y plane in which the PCB is placed when the PCB is loaded into a position for forming the insulating dam. To detect the posture after the loading of the PCB, the material discharge device 200 may include the PCB reference position measurement sensor 233 and a PCB height measurement sensor.

The PCB reference position measurement sensor 233 may be a sensor configured to determine a PCB loading regular position and may include a imaging camera. The PCB reference position measurement sensor 233 may detect whether or not the PCB, which is loaded into the working space to form the shielding structure, is located in a preset position or may detect a distorted difference from the preset position. For example, in response to the PCB is loaded into a working position, the controller 250 may move the PCB reference position measurement sensor 233 to a preset coordinate of a first reference mark, image the current first reference mark of the PCB, and determine whether or not the PCB reference position measurement sensor 233 is located in the regular position by comparing the currently imaged first reference mark and a preset shape of the first reference mark.

In response to determining that the PCB reference position measurement sensor 233 is located in the regular position, the controller 250 may calculate a position difference between the current coordinate of the first reference mark and the preset coordinate of the first reference mark. Subsequently, the controller 250 may calculate a position difference between a current coordinate of a second reference mark and a preset coordinate of the second reference mark through the same method as the method of calculating the position difference in the coordinate of the first reference mark.

The material discharge device 200 may include a PCB loading and unloading unit 235 configured to load the PCB into the working position to form the insulating dam in the PCB and unload the PCB after the formation of the insulating dam is completed.

The material discharge device 200 may include PCB heater 236 configured to raise a temperature of the PCB to a fixed value to shorten a dry time of the formed insulating dam 121.

The material discharge device 200 may include an input unit 253 configured to directly input moving routes of the first and second nozzles 216 and 217 by the user.

The input unit 253 may include a touch screen for touch input or a conventional key pad. The user may input the moving routes of the first and second nozzles 216 and 217 through the input unit 253. The moving routes of the first and second nozzles input once through the input unit 253 may be stored in the memory 251. The user may correct the nozzle route data stored in the memory 251 through the input unit 253.

Hereinafter, a process of inputting the nozzle moving route of the first nozzle 216 through the input unit 253 will be described.

First, at least two reference marks provided on the PCB loaded into a working position may be imaged through the PCB reference position measurement sensor 233, for example, including a imaging camera (hereinafter, referred to as imaging camera), a distance between the two reference marks may be measured, and the images of the reference marks and the distance value between the two reference marks may be stored in the memory 251. When the PCB has a rectangular shape, the two reference marks may be provided at an upper left portion and a lower right portion of the PCB. The distance between the two reference marks may be substantially represented with a straight-line length of the PCB in a diagonal direction.

For example, when the PCB is loaded into the working position, the user may move the imaging camera to a position in which the first reference mark at the upper left portion of the PCB is located (for example, on the basis of the center of the first reference mark or a portion of the first reference mark) through front, back, left, and right moving buttons provided in the input unit 253 and then press a storage button provided in the input unit 253. The controller 250 may calculate coordinates X1, Y1, and Z1 of the first reference mark by calculating a distance of the first reference mark spaced from the preset origin (0,0,0) and store the calculated coordinates X1, Y1, and Z1 in the memory 251. The imaging position of the imaging camera which moves together with the first nozzle 216 may be offset at a fixed interval from the center of the first nozzle 216. Accordingly, the X1, Y1, and Z1 coordinates of the first reference mark may be calculated through the controller 250 in consideration of the offset value. In response to a shoot button being pressed by the user, the image of the first reference mark may be stored in the memory 251.

Subsequently, the user may move the imaging camera to a position in which the second reference mark at the lower right portion of the PCB is located (for example, on the basis of the center of the second reference mark or a portion of the second reference mark) through the front, back, left, and right moving buttons provided in the input unit 253 and then press the storage button provided in the input unit 253. The controller 250 may calculate coordinates X2, Y2, and Z2 of the second reference mark by calculating a distance of the second reference mark spaced from the preset origin (0,0,0) and store the calculated coordinates X2, Y2, and Z2 in the memory. In response to the shoot button being pressed by the user, the image of the second reference mark may be stored in the memory 251. Similar to the process of calculating the coordinates X1, Y1, and Z1 of the first reference mark described above, the coordinates X2, Y2, and Z2 of the second reference mark may also be calculated by the controller 250 in consideration of the offset value.

The controller 250 may calculate a distance between two positions of the first and second reference marks using the detected positions of the first and second reference marks described above and store the calculated distance in the memory 251.

Then, while the user moves the imaging camera along a route of the insulating dam 121 to be formed on the PCB 110 using the front, rear, left, and right moving buttons of the input unit 253, the user may view a real-time image obtained through the imaging camera and simultaneously input a plurality of coordinates located on the moving route of the first nozzle 216. The corresponding coordinates may be input in response to a coordinate input button provided in the input unit 253 being pressed in a state that the imaging camera is located in any one point of the moving route of the first nozzle 216. The input coordinates may be stored in the memory 251.

The plurality of coordinates may include a coordinate (see Ap of FIG. 4) at a point that the first nozzle 216 starts to discharge a material, a coordinate at a point that the first nozzle 216 stops to discharge the material (for example, when the insulating dam is in a closed-loop form, the stop point may be disposed close to the start point Ap.), and coordinates for points (see Bp, Cp, Dp, Ep, and Fp of FIG. 4) that the first nozzle 216 changes the direction during movement.

To program the moving route of the first nozzle 216, the input unit 253 may include a moving button that is manipulated to move the first nozzle 216 to a designated coordinate, a line button configured to input a command which allows the first nozzle 216 to move and simultaneously to discharge the material, and various command buttons such as a rotation button that is manipulated to switch the moving direction of the first nozzle 216. The user may generate the moving route of the first nozzle 216 by matching the command buttons with the coordinate and a rotation angle.

In response to the moving route of the first nozzle 216 being programmed by the user as described above, the controller 250 may automatically form the insulating dam 121 in the PCB 110 by controlling the first nozzle 216 to move along the nozzle moving route while simultaneously discharging the insulating material.

The nozzle route data of the first nozzle 216 input through the input unit 253 may be stored in the memory 251. The controller 250 may move the first nozzle 216 along the previously input route by driving the X-Y-Z-axis moving unit 231 and the rotation driver 219 according to the nozzle route data of the first nozzle stored in the memory 251. The nozzle route data may include a distance that the first nozzle 216 moves to a straight direction along the top surface of the PCB 110 and the rotation direction and angle of the first nozzle 216.

It has been described in the exemplary embodiment that the user directly inputs the moving route of the first nozzle 216 through the input unit 253, but embodiments are not limited thereto. For example, the nozzle moving route may be pre-stored in the memory 251. In this example, a plurality of nozzle moving routes for the first nozzle 216 may be pre-stored to correspond to patterns of the insulating dams 121 variously formed according to products. In addition to the moving route of the first nozzle input through the input unit 253, calibration information, reference position information of the first nozzle, reference position information of the PCB, reference height information of the PCB, and the like may be pre-stored in the memory 251.

As described above, the insulating dam 121 may be formed along the moving route of the first nozzle stored in the memory 251 using the first nozzle 216 and a detailed example will be described with reference to FIG. 4.

Figure 4:
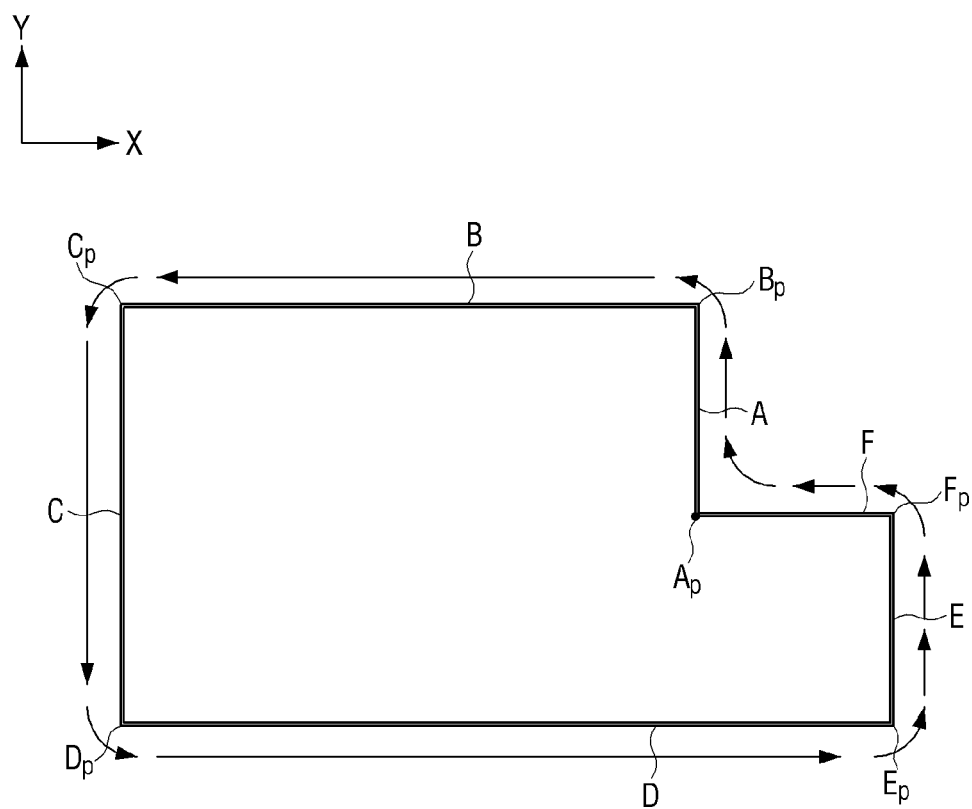
FIG. 4 is a diagram illustrating a moving route of a first nozzle input through an input unit provided in a material discharge device according to an embodiment.

FIG. 4 is a diagram illustrating a moving route of a first nozzle input through an input unit provided in a material discharge device according to an exemplary embodiment.

The first nozzle 216 may be set to a coordinate corresponding to the start point Ap. The controller 250 may drive the rotation driver 219 to rotate the first nozzle 216 to a fixed angle so that an inner surface 216c of the side guide part 216b of the first nozzle 216 is directed toward the inner side of the shielding region.

The first nozzle 216 which is set to the coordinate corresponding to the start point Ap may linearly move in +Y-axis direction along an A section through the X-Y-Z-axis moving unit 231. Then, the first nozzle 216 may moves along a section that a route is bent (a section including a point Bp which couples the A section and a B section). The first nozzle 216 may move along the nozzle moving route through the X-Y-Z-axis unit 231 and simultaneously rotate through the rotation driver 219 so that the inner surface 216c of the side guide part 216b of the first nozzle 216 is continuously directed toward the inner side the shielding region.

After the first nozzle 216 passes through the section that the route is bent, the first nozzle 216 may linearly move in an −X-axis direction along the B section through the X-Y-Z-axis moving unit 231. The first nozzle 216 may sequentially repeat the linear movement and rotation with respect to the remaining C, D, E, and F sections through the X-Y-Z-axis moving unit 231 and the rotation driver 219. In response to the first nozzle 216 being returned to the start point Ap, the route movement of the first nozzle 216 may be completed.

Figure 5A:
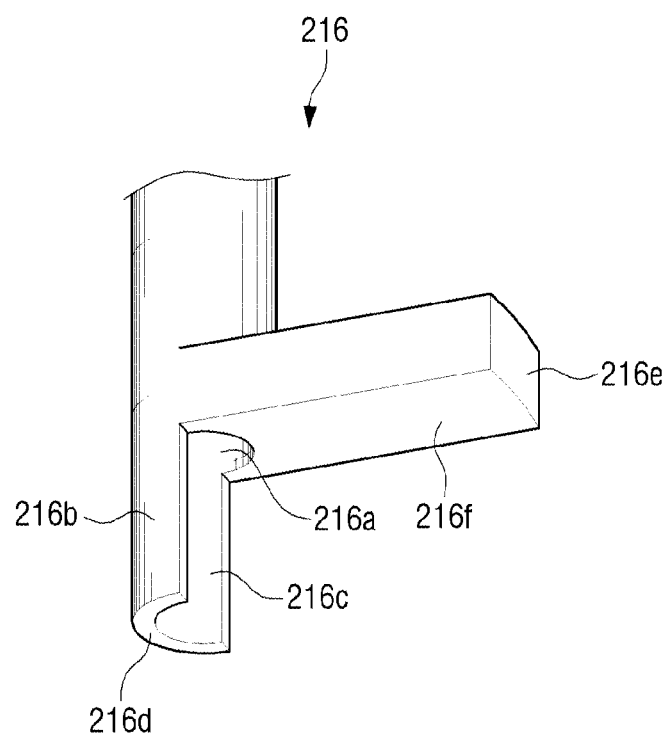
FIGS. 5A and 5B are diagrams illustrating a first nozzle of a material discharge device according to an exemplary embodiment.
Figure 5B:
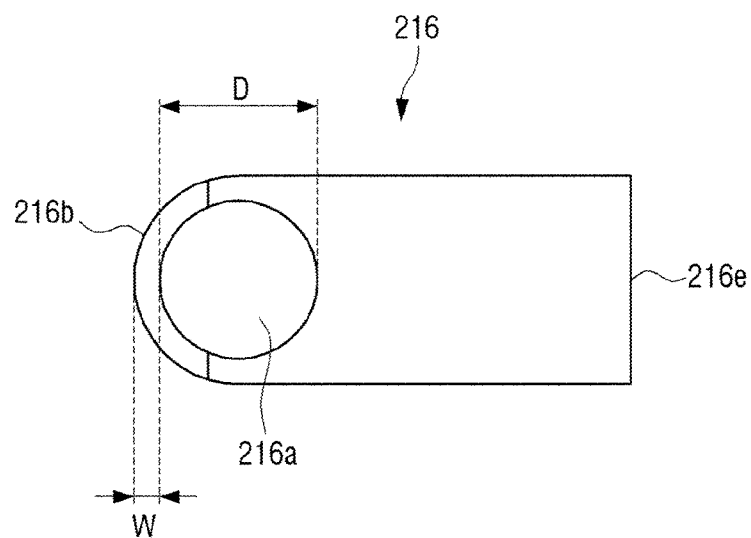
Figure 6:
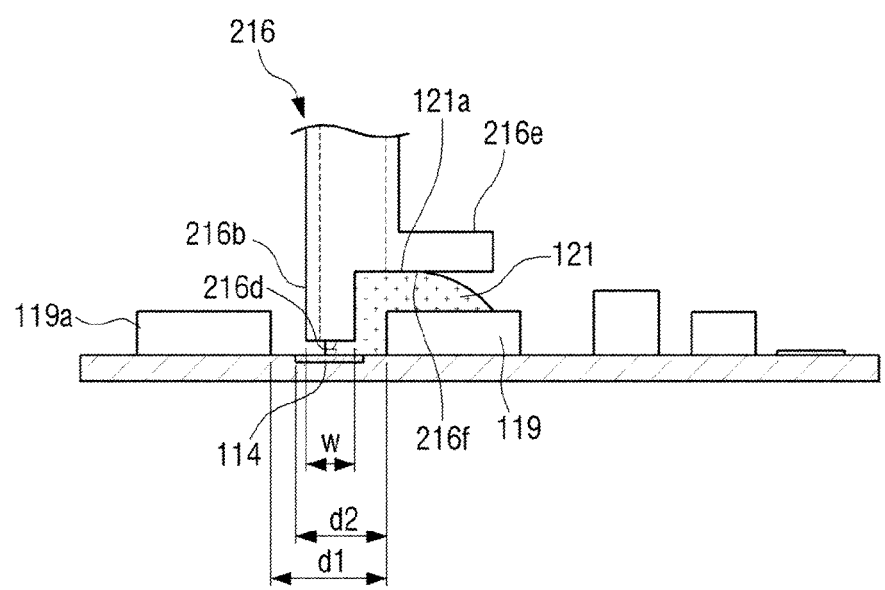
FIG. 6 is a diagram illustrating an example of forming an insulating dam through a first nozzle according to an exemplary embodiment.

Hereinafter, the first nozzle 216 will be described with reference to FIGS. 5A, 5B, and 6. FIGS. 5A and 5B are diagrams illustrating a first nozzle of a material discharge device according to an exemplary embodiment and FIG. 6 is a diagram illustrating an example of forming an insulating dam through a first nozzle according to an exemplary embodiment.

Referring to FIG. 5A, a discharge hole 216a configured to discharge an insulating material may be formed in a lower side of the first nozzle 216 and the side guide part 216b and the top guide part 216e may be formed to be protruded from the discharge hole 216a.

The discharge hole 216a may be disposed in a position corresponding to a virtual outer periphery of the shielding region when the first nozzle 216 is set to a position for discharging the insulating material to form the insulating dam 121. A portion of the discharge hole 216a may be located over the ground pad 114 as illustrated in FIG. 6.

The side guide part 216b may be formed to be elongated downward from a lower end of the discharge hole 216a along a length direction of the first nozzle 216. Referring to FIG. 6, the side guide part 216b may be disposed between the circuit element 119 located in the shielding region and a circuit element 119a located outside of the shielding region. The side guide part 216b may be formed to have a width w of less than 0.8 mm so that the circuit elements 119 and 119a may not interfere with the side guide part 216b on the assumption that an interval between the circuit elements 119 and 119a is 0.8 mm. For example, the side guide part 216b may be formed to have the width w of 0.35 mm. In this example, a distance from an outer surface of the side guide part 216b to a side surface of the circuit element 119 located in the shielding region may be maintained to 0.55 mm. Referring to FIG. 5B, the width w of the side guide part 216b may be formed smaller than a diameter D of the discharge hole 216a.

Referring to FIG. 6, the side guide part 216b may guide an insulating material discharged from the discharge hole 216a and guide the insulating material to the inner side of the shielding region. Simultaneously, the side guide part 216b may guide the insulating material onto the ground pad 114 so as to prevent the insulating material from flowing far away from the outer periphery of the shielding region and to minimize contact with the ground pad 114.

The inner surface 216c of the side guide part 216b may be formed in a curved surface as illustrated in FIG. 5A, but embodiments are not limited thereto and the inner surface 216c of the side guide part 216b may be formed in a flat surface.

A lower end 216d of the side guide part 216b may be maintained to be spaced apart from a top surface of the PCB 110 at fixed interval so that the top surface of the PCB 110 may not interfere with the first nozzle 216 while the first nozzle 216 moves along the moving route. For example, when the first nozzle 216 is set to a discharge position, a height of the first nozzle 216 in the Z-axis direction may be set in consideration of the interval between the lower end 216d of the side guide part 216b and the top surface of the PCB 110.

The top guide part 216e may be formed to protrude from one side of the discharge hole 216a in a direction substantially perpendicular to the length direction of the first nozzle 216.

The top guide part 216e may guide the insulating material discharged from the discharge hole 216a toward the inner side of the shielding region together with the side guide part 216b so that the insulating dam 121 may be formed to have a fixed width.

A bottom surface 216f of the top guide part 216e may be flat and extend in parallel to the top surface of the PCB 110 and thus the top surface 121a of the insulating dam 121 may be formed to be flat. When the top surface 121a of the insulating dam 121 is formed to be flat, the top surface 125a of the insulating member 125 formed after the insulating dam 121 is formed may be located substantially to be coplanar with the top surface 121a of the insulating dam 121 without no step. When the shielding layer 150 covering the outer surface of the insulating structure 120 is formed in a subsequent process, the top surface of the shielding layer 150 may also be formed to be flat.

Hereinafter, the second nozzle 217 configured to form the insulating member 125 will be described with reference to FIGS. 7 and 8. FIG. 7 is a plan view illustrating an insulating dam formed in a shielding region according to an exemplary embodiment and FIG. 8 is a diagram illustrating an example of forming an insulating member in a space surrounded with an insulating dam through a second nozzle of a material discharge device according to an exemplary embodiment.

Referring to FIG. 7, the insulating dam 121 formed along an outer periphery of the shielding region may cover some of circuit elements (for example, circuit elements located in a position spaced at interval from the outer periphery of the shielding region toward the inner side) located in the shielding region. The insulating member 125 may be formed by injecting an insulating material into the space S formed in the inner side of the insulating dam 121 to cover the remaining circuit elements uncovered with the insulating dam 121.

Referring to FIG. 8, the second nozzle 217 configured to form the insulating member 125 may discharge an insulating material while moving over the space S along the X-Y-axis direction. A lower end 217a of the second nozzle 217 may be set to a fixed height in the Z-axis direction so that the upper end of the insulating dam 121 formed before the insulating member 125 is formed may not interfere with the lower end 217a of the second nozzle 217 while the second nozzle 217 moves to the X-Y-axis direction.

The insulating material discharged from the second nozzle 217 may have a fluidity to be filled within the space S as described above. The controller 250 may control the discharge amount of the insulating material discharged from the second nozzle 217 so that the top surface 125a of the insulating member 125 is coplanar with the top surface 121a of the insulating dam 121.

Hereinafter, the third nozzle 218 configured to form the shielding layer 150 will be described with reference to FIG. 9. FIG. 9 is a diagram illustrating an example of forming a shielding layer in a state that an insulating dam and an insulating member are formed.

The third nozzle 218 may include an inner tube 218a configured to spray a liquefied shielding material having fluidity and an outer tube 218b which surrounds the inner tube 218a. An inner circumference of the outer tube 218b is spaced from an outer circumference of the inner tube 218a. The third nozzle 218 may be a Coanda nozzle employing the Coanda effect.

A high-pressure atomizing gas may flow between the inner tube 218a and the outer tube 218b of the third nozzle 218. The atomizing gas may serve as an air curtain 223 surrounding a shielding material 221 sprayed from the inner tube 218a while the atomizing gas is spayed outward. Accordingly, the shielding material 221 spayed in an atomizing form may be guided by the air curtain 223 and may be applied only to a certain region (for example, the entire outer surface of the insulating structure 120 and the ground pad 114). Accordingly, the shielding material 221 may be prevented from being applied to regions of the PCB other than the shielding region.

The third nozzle 218 may be tilted at a fixed angle while the shielding material 221 is sprayed toward the side surface of the insulating structure 120. The third nozzle 218 may maintain a posture substantially perpendicular to the top surface of the insulating structure 120 while the shielding material 221 is sprayed toward the top surface of the insulating structure 120.

The controller 250 may control the moving speed of the third nozzle 218 and the discharge amount of the shielding material to form the shielding layer 150 covering the outer surface of the insulating structure 120.

For example, the third nozzle 218 may be provided in a separate spray device configured to spray liquid in an atomizing form. In this example, the spray device may include a storage tank in which a shielding material is stored, a storage tank in which an atomizing gas is stored, and a certain compressor. In another example, the spray device and the third nozzle 218 may be provided as a component of the material discharge device 200.

In the EMI shielding structure 100 according to an exemplary embodiment, the shielding layer 150 may be formed to simultaneously cover the entire outer surface of the insulating structure 120 and the ground pad 114 through a single process using the third nozzle 218. In another example, the shielding layer 150 may be formed by forming a first shielding layer in the side surface of the insulating structure 120, a portion of the top surface of the insulating structure 120 close to the side surface, and the ground pad 114 and forming a second shielding layer in the remaining portion of the top surface of the insulating structure 120. A shielding structure 300 in which a shielding layer is formed in two parts will be described with reference to FIG. 10.

Figure 10:
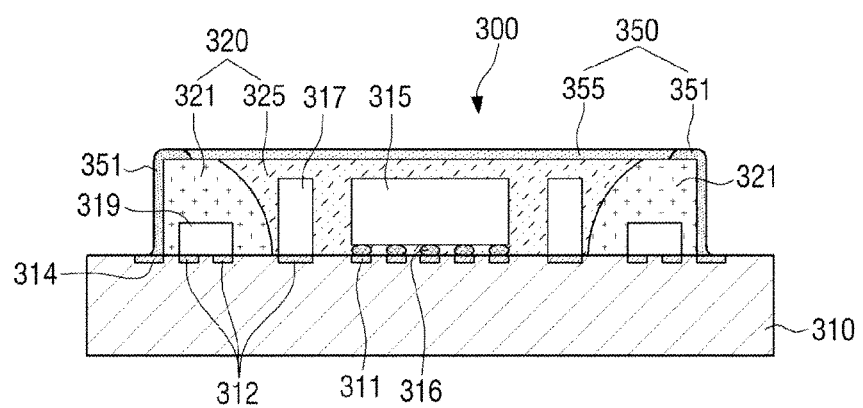
FIG. 10 is a cross-sectional diagram illustrating an EMI shielding structure according to another exemplary embodiment.

FIG. 10 is a cross-sectional diagram illustrating an EMI shielding structure according to another exemplary embodiment.

Referring to FIG. 10, the shielding structure 300 according to another exemplary embodiment may include an insulating structure 320 configured of an insulating dam 321 and an insulating member 325 in a shielding region of a PCB 310 on which a plurality of circuit elements 315, 317, and 319 are mounted and a shielding layer 350 covering the entire outer surface of the insulating structure 320. The reference numerals 311, 312, and 316 refer to a first connection pad, a second connection pad, and a connection terminal, respectively.

The insulating structure 320 configured of the insulating dam 321 and the insulating member 325 and a manufacturing method thereof are the same as the insulating structure 120 in the EMI shielding structure 100 and the manufacturing thereof as described above and thus detailed description thereof will be omitted and hereinafter, a structure of the shielding layer 350 and a manufacturing method thereof which are different from the structure of the shielding layer 150 in the EMI shielding structure 100 and the manufacturing method thereof will be described.

The shielding layer 350 may include a first shielding part 351 which covers a side surface of the insulating dam 321 and a portion of a top surface of the insulating dam 321 close to the side surface and a second shielding part 355 which covers the remaining portion of the top surface of the insulating dam 321 uncovered with the first shielding part 351 and a top surface of the insulating member 325. Boundary portions of the first and second shielding parts 351 and 355 may be in contact with each other and thus the first and second shielding parts 351 and 355 may be electrically coupled to each other.

Figure 11:
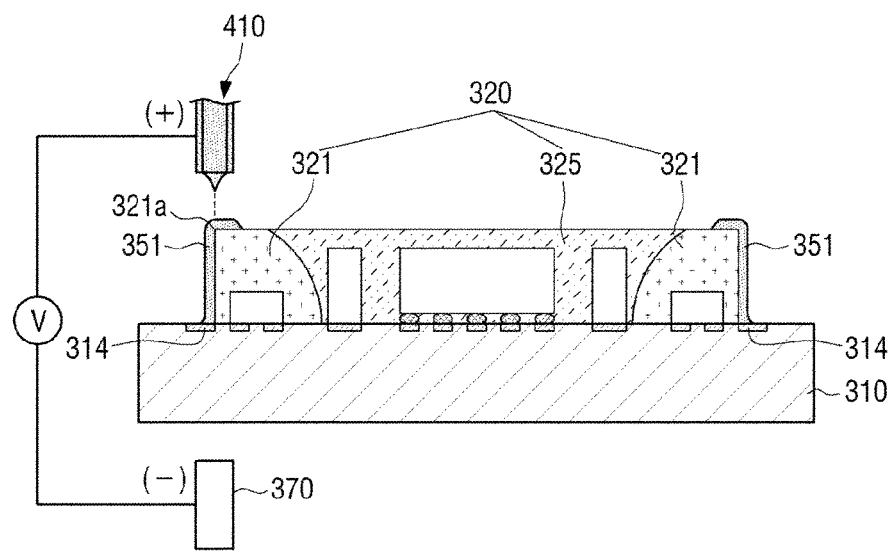
FIGS. 11 and 12 are diagrams illustrating examples of forming a shielding layer along a side portion of an insulating structure with a cone-jet mode and a tilting-jet mode as a precise prototyping method according to an exemplary embodiment.
Figure 12:
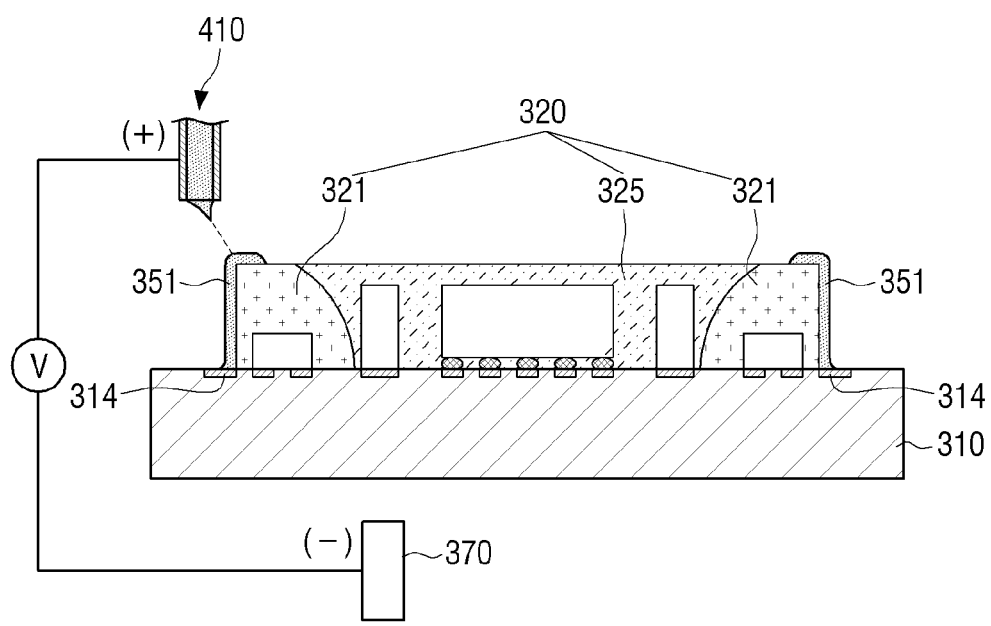

FIGS. 11 and 12 are diagrams illustrating examples of forming a shielding layer along a side portion of an insulating structure with a cone-jet mode and a tilting-jet mode as a precise prototyping method according to an exemplary embodiment and FIGS. 13A to 13D are schematic diagrams illustrating various EHD inkjet printing devices for forming a side portion of a shielding layer with a tilting-jet mode according to an exemplary embodiment.

Referring to FIG. 11, the first shielding part 351 may be formed of a shielding material discharged from a nozzle 410 provided in an EHD inkjet printing device. The EHD inkjet printing device may apply voltages to the nozzle 410 and a pin type electrode 370 so that the shielding material having electric conductivity may be discharged from the nozzle 410 toward the PCB 310 by a potential difference. For example, a positive (+) voltage may be applied to the nozzle 410 and a negative (−) voltage may be applied to the pin type electrode 370 located below the PCB 310.

In the cone-jet mode, the nozzle 410 and the pin type electrode 370 may be located on the same axis and a droplet discharged from the nozzle 410 may be dropped in a substantially vertical direction with respect to the top surface of the insulating dam 321 and may cover the top surface of the insulating dam 321. When the side surface of the insulating dam 321 is coated with the cone-jet mode, the position of the nozzle 410 may be set so that the droplet discharged from the nozzle 410 is dropped to a corner 321a of the insulating dam 321. The droplet dropped to the corner 321a may roll down by gravity along the side surface of the insulating dam 321 and may cover the side surface of the insulating dam 321. The discharge amount of the shielding material may be controlled so that the shielding material rolled down along the side surface of the insulating dam 321 may not reach the ground pad 314.

The first shielding part 351 may also be formed with the tilting-jet mode as illustrated in FIG. 12. In the tilting-jet mode, the nozzle 410 and the pin type electrode 370 may not be disposed on the same axis so that the droplet discharged from the nozzle 410 may be dropped toward the insulating dam 321 to the non-vertical direction. For example, the nozzle 410 may be disposed in a position spaced at a fixed interval from the outer side surface of the insulating dam 321 in an upper side of the insulating dam 321 and the pin type electrode 370 may be disposed to be spaced at a fixed interval from the inner side surface of the insulating dam 321. When the voltages are applied in a state that the nozzle 410 and the pin type electrode 370 are located on different axes, the droplet discharged from the nozzle 410 may be discharged toward the side surface of the insulating dam 321 and may be applied to the side surface of the insulating dam 321.

The shielding material may roll down along the insulating dam 321 and move onto the ground pad 314. The shielding material having a large fluidity may pass through the ground pad 314 and move to a position out of the ground pad 314. Accordingly, to overcome the problem, the viscosity of the shielding material may be in a range of 1,000 cps to 100,000 cps.

The discharge direction of a droplet discharged from the nozzle 410 may be controlled by moving the nozzle 410 in a horizontal direction in a state that the pin type electrode 370 is fixed or by moving the pin type electrode 370 to the horizontal direction in a state that the nozzle 410 is fixed. The discharge direction of the droplet discharged from the nozzle 410 may be controlled by simultaneously moving the nozzle 410 and the pin type electrode 370 in horizontal directions different from each other. Changing between the cone-jet mode and the tilting-jet mode may be accomplished by moving at least one of the nozzle 410 and the pin type electrode 370.

The discharge direction of the droplet discharged from the nozzle 410 may be controlled by various changing the shape and position of the pin type electrode 370. The method of controlling the discharge direction of the droplet will be described with reference to FIGS. 13A to 13D. FIGS. 13A to 13D are schematic diagrams various EHD inkjet printing devices configured to form a side portion of a shielding layer with a tilting-jet mode.

Figure 13A:
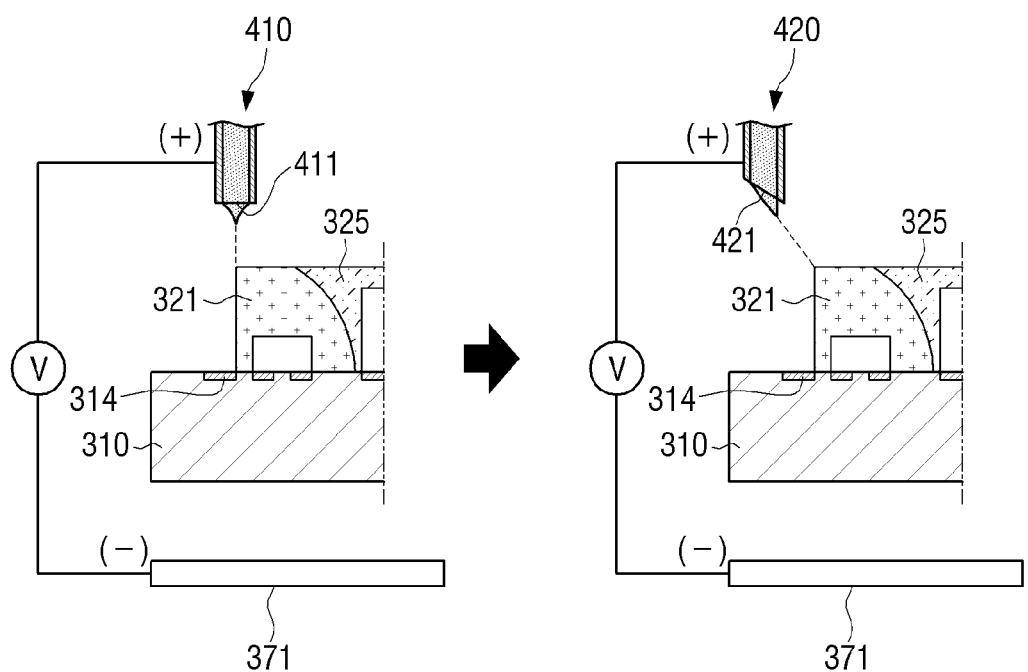
FIGS. 13A, 13B, 13C and 13D are schematic diagrams illustrating various electrohydrodynamic (EHD) inkjet printing devices for forming a side portion of a shielding layer with a tilting-jet mode according to an exemplary embodiment.

Referring to FIG. 13A, the EHD inkjet printing device may include a flat plate type electrode 371 to which a negative voltage is applied other than the pin type electrode 370. The flat plate type electrode 371 may be disposed below the PCB 310 and have a larger area than the pin type electrode 370. The flat plate type electrode 371 may have an area substantially corresponding to an entire area of the PCB 110.

In the cone-jet mode, the nozzle 410 having a lower end 411 formed substantially in parallel to the PCB 110 may be used as illustrated in the left drawing of FIG. 13A. Accordingly, the droplet discharged from the nozzle 410 may be dropped in a substantially vertical direction with respect to the top surface of the insulating dam 321.

In the tilting-jet mode, the nozzle 420 having a lower end 421 formed to be inclined to one side may be used as illustrated in the right drawing of FIG. 13A. The discharge direction of the droplet may be changed according to an inclined direction of the lower end 421 of the nozzle 420. For example, the droplet discharged from the nozzle 420 may be directed in the right direction in the right drawing of FIG. 13A. In this example, when the nozzle 420 is rotated about 180 degrees about the central axis, the discharge direction of the droplet may be changed from the right direction to the left direction. Accordingly, the discharge direction of the droplet may be controlled by rotating the nozzle 420.

Figure 13B:
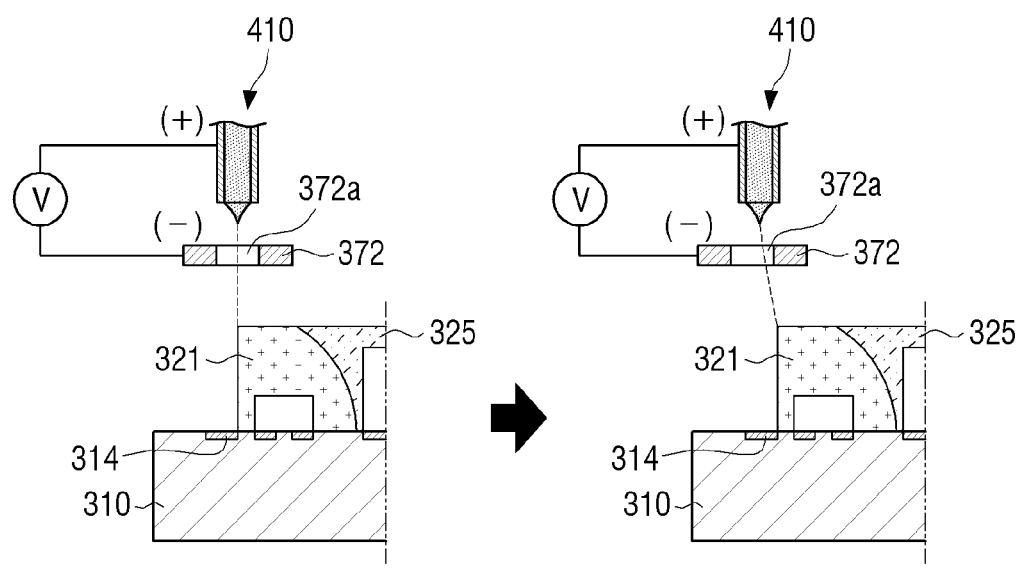

Referring to FIG. 13B, the EHD inkjet printing device may include a guide ring type electrode 372 to which a negative voltage is applied other than the pin type electrode 370. The guide ring type electrode 372 may be disposed between the nozzle 410 and the PCB 310 and a hole 372a which the droplet passes therethrough may be formed in the center of the guide ring type electrode 372.

In the cone-jet mode, the center of the hole 372a of the guide ring type electrode 372 may be aligned with the center of the nozzle 410 as illustrated in the left drawing of FIG. 13B. Accordingly, the droplet discharged from the nozzle 410 may be dropped in a substantially vertical direction with respect to the top surface of the insulating dam 321.

In the tilting-jet mode, the center of the hole 372a of the guide ring type electrode 372 may be offset to the left with respect to the center of the nozzle 410 as illustrated in the right drawing of FIG. 13B. Accordingly, the droplet discharged from the nozzle 410 to which a positive voltage is applied may pass through the hole 372a of the guide ring type electrode 372 to which a negative voltage is applied and then may be dropped in a fixed angle in a right direction close to an inner circumference of the hole 372a by attraction force. The discharge direction of the droplet may be controlled by eccentrically arranging the center of the hole 372a of the guide ring type electrode 372 with respect to the center of the nozzle 410 by horizontally moving the guide ring type electrode 372 to the left or the right.

Figure 13C:
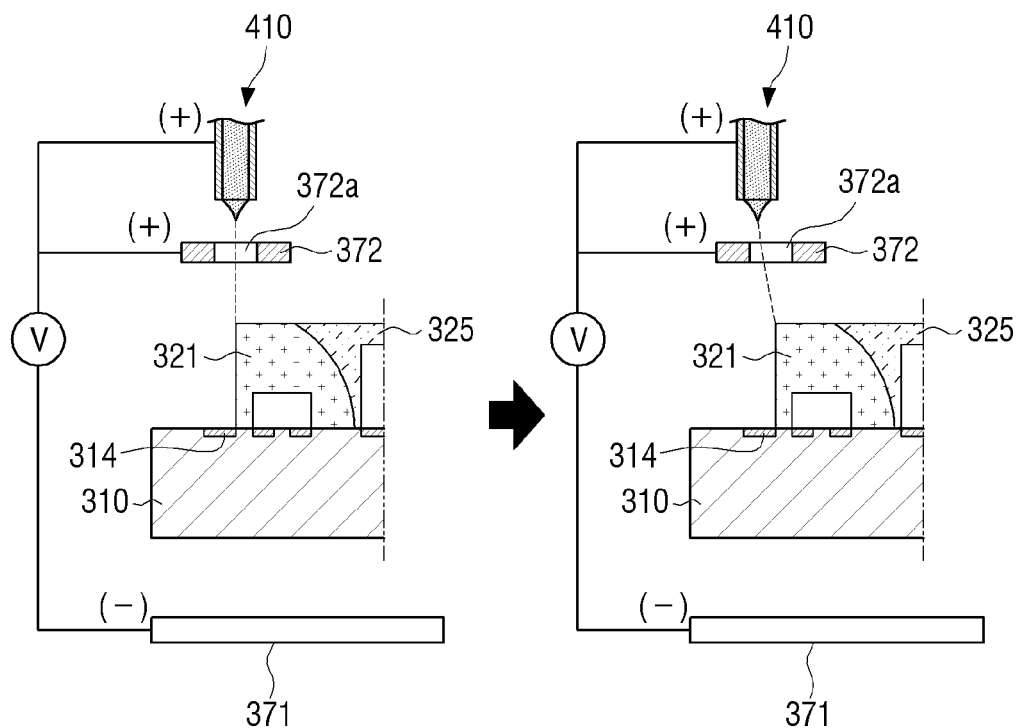

Referring to FIG. 13C, the EHD inkjet printing device may include the flat plate type electrode 371 to which a negative voltage is applied together with the guide ring type electrode 372 to which a positive voltage is applied other than the pin type electrode 370. The flat plate type electrode 371 may be disposed below the PCB 310 and the guide ring type electrode 372 may be disposed between the nozzle 410 and the PCB 310.

In the cone-jet mode, the center of the hole 372a of the guide ring type electrode 372 may aligned with the center of the nozzle 410 as illustrated in the left drawing of FIG. 13C. Accordingly, the droplet discharged from the nozzle 410 may be dropped in a substantially vertical direction toward the top surface of the insulating dam 321 through the flat plate type electrode 371 to which the negative voltage is applied.

In the tilting-jet mode, the center of the hole 372a of the guide ring type electrode 372 may be offset to the right with respect to the center of the nozzle 410 as illustrated in the right drawing of FIG. 13C. Accordingly, the droplet discharged from the nozzle 410 to which the positive voltage is applied may pass through the hole 372a of the guide ring type electrode 372 to which the positive voltage is applied and then may be dropped at a fixed angle in the right direction by repulsion. The discharge direction of the droplet may be controlled by eccentrically arranging the center of the hole 372a of the guide ring type electrode 372 with respect to the center of the nozzle 410 by horizontally moving the guide ring type electrode 372 to left or right.

After the first shielding part 351 is formed as described above, the second shielding part 355 may be formed in the insulating structure 320 by changing the discharge mode to a jetting mode or a spraying mode as a rapid prototyping method and discharging a shielding material through the same nozzle. The second shielding part 355 may be formed through the rapid prototyping method and thus the shielding material supplied to form the second shielding part 355 may having a large fluidity and have a viscosity in a range of 50 cps to 10,000 cps.

Figure 13D:
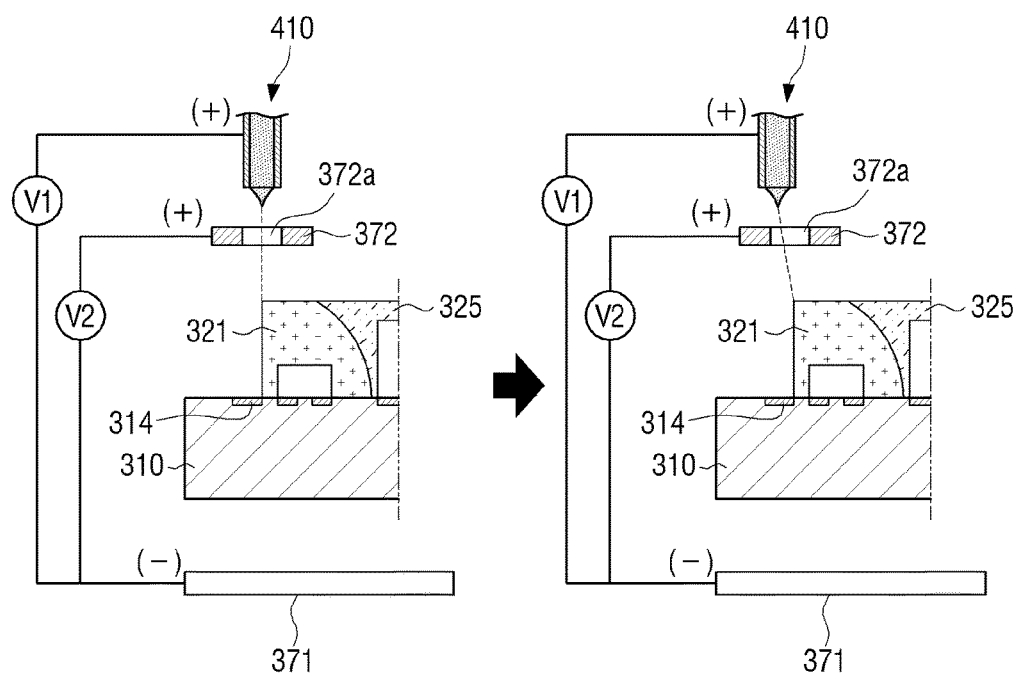
Figure 14:
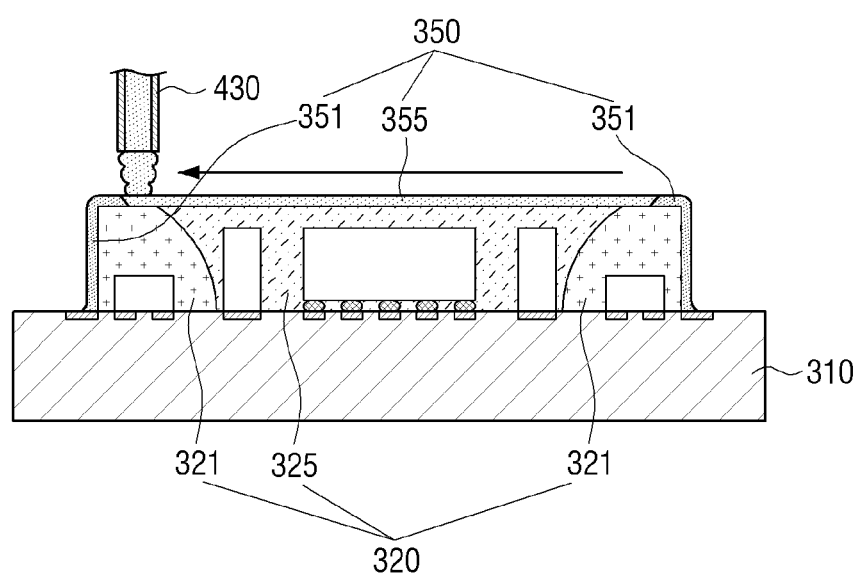
FIGS. 14 and 15 are diagrams illustrating examples of forming a shielding layer on a top surface of an insulating structure with a jetting mode and a spraying mode as a rapid prototyping method according to an exemplary embodiment.
Figure 15:
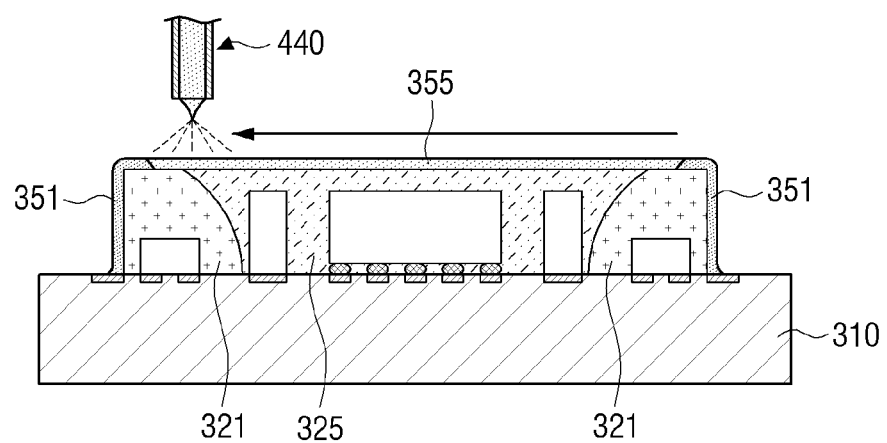

Referring to FIG. 13D, power may be applied to the nozzle 410 and the guide ring type electrode 372 through separate power sources. For example, the nozzle 410 may be coupled to a first voltage applying unit V1 and the guide ring type electrode 372 may be coupled to a second voltage applying unit V2. In this example, the first and second voltage applying units V1 and V2 may apply the same voltage or different voltages to the nozzle 410 and the guide ring type electrode 372. FIGS. 14 and 15 are diagrams illustrating examples of forming a shielding layer on a top surface of an insulating structure with a jetting mode and a spraying mode as a rapid prototyping method.

Referring to FIG. 14, when the second shielding part 355 is formed with the jetting mode, a nozzle 430 may discharge an amount of shielding material per unit time larger than that in the forming of the first shielding part 351. The nozzle 430 may discharge the shielding material while moving along the top surface of the insulating structure 320. For example, the shielding material discharged from the nozzle 430 may cover the top surface of the insulating dam 321 and the top surface of the insulating member 325. In this example, boundary portions of the first and second shielding parts 351 and 355 may be formed to be electrically coupled to each other.

Referring to FIG. 15, when the second shielding part 355 is formed with the spraying mode, a nozzle 440 may discharge a shielding material in an atomizing form and the nozzle 440 may discharge an amount of shielding material per unit time that is larger than that in the forming of the first shielding part 351. The nozzle 440 may discharge the shielding material while moving along the top surface of the insulating structure 320. For example, the shielding material discharged from the nozzle 440 may cover the top surface of the insulating dam 321 and the top surface of the insulating member 325. In this example, boundary portions of the first and second shielding parts 351 and 355 may be formed to be electrically coupled to each other.

Figure 16A:
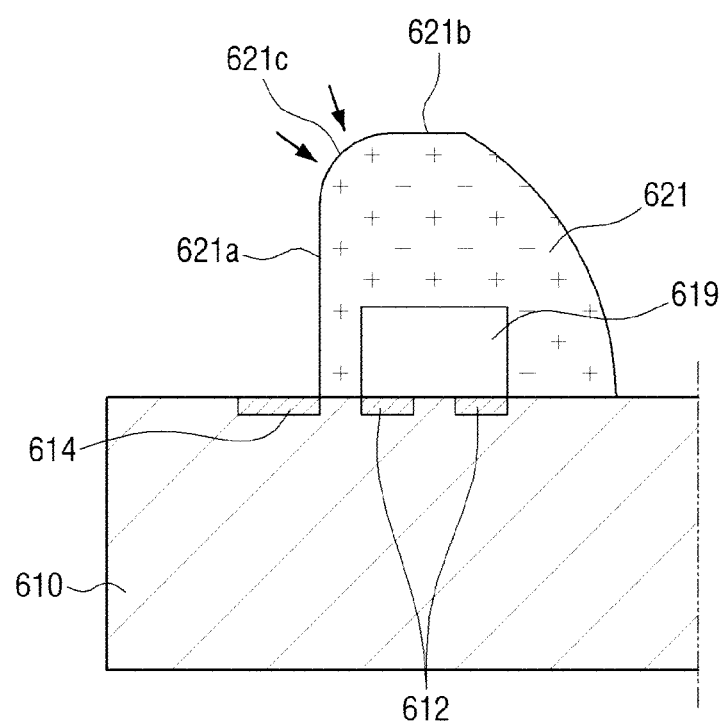
FIGS. 16A, 16B and 16C are diagrams illustrating examples of a cross-section of an insulating dam having a rounded corner, a nozzle for forming the insulating dam, and a shielding layer formed on a side surface and a portion of a top surface of the insulating dam according to an exemplary embodiment.
Figure 16B:
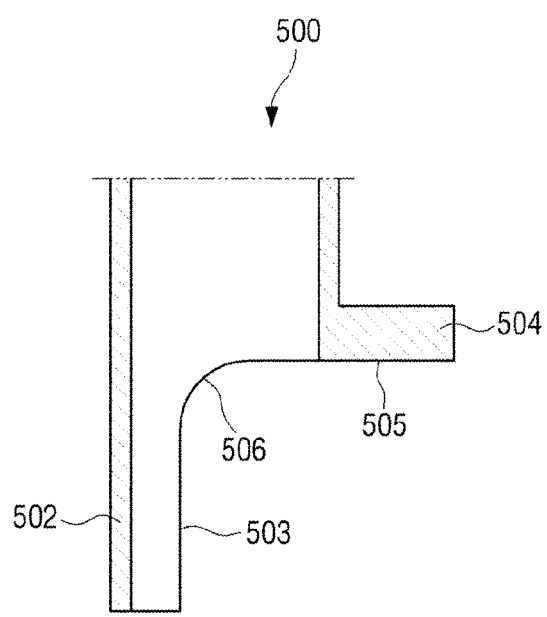
Figure 16C:
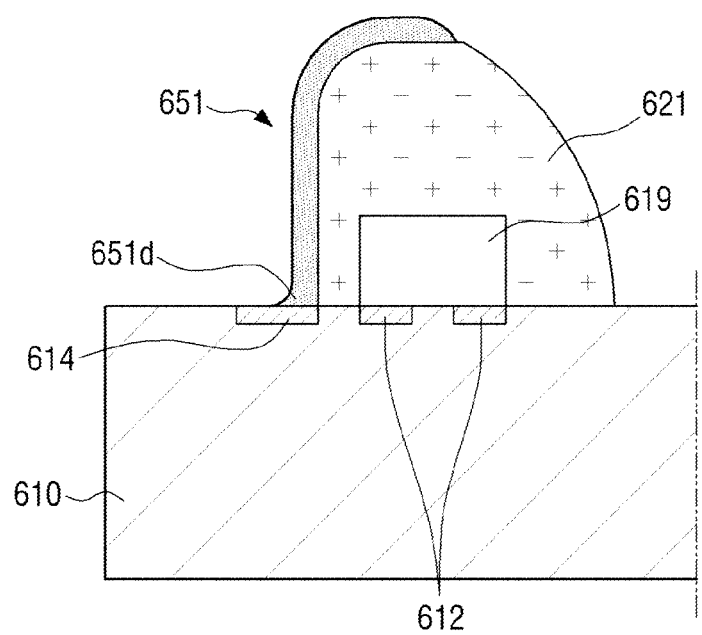
Figure 17A:
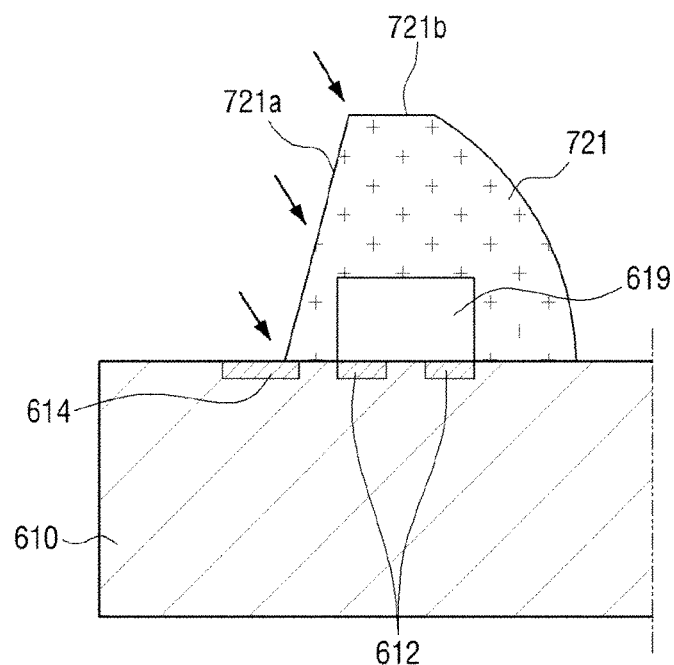
FIGS. 17A, 17B and 17C are diagrams illustrating examples of a cross-section of an insulating dam having an inclined side surface, a nozzle for forming the insulating dam, and a shielding layer formed on the side surface and a portion of a top surface of the insulating dam according to an exemplary embodiment.
Figure 17B:
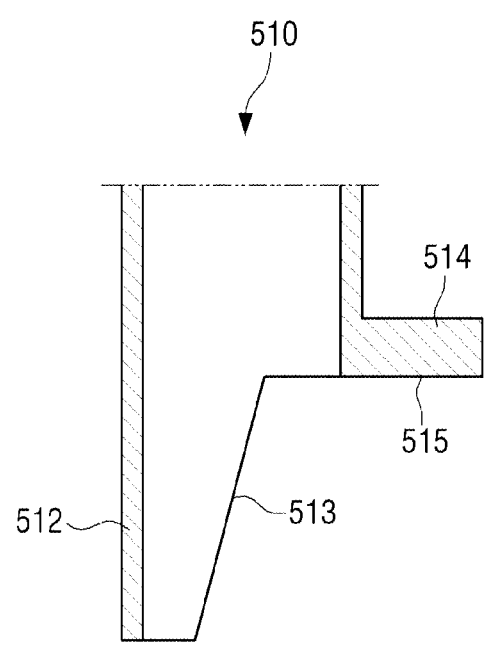
Figure 17C:
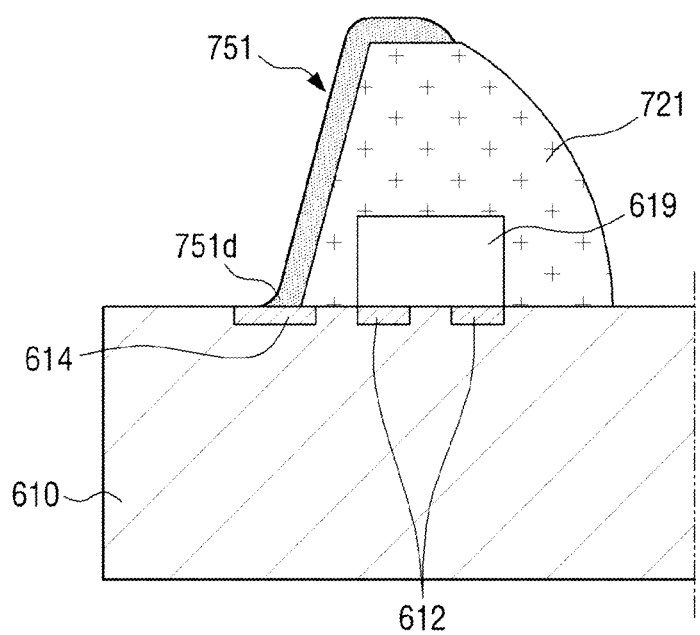
Figure 18A:
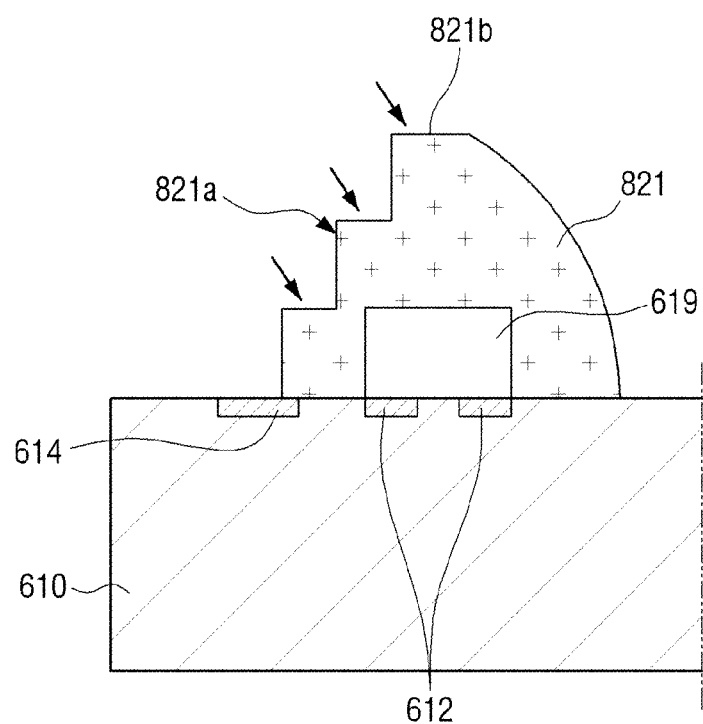
FIGS. 18A, 18B and 18C are diagrams illustrating examples of a cross-section of an insulating dam having a stepped side surface, a nozzle for forming the insulating dam, and a shielding layer formed on the side surface and a portion of a top surface of the insulating dam according to an exemplary embodiment.
Figure 18B:
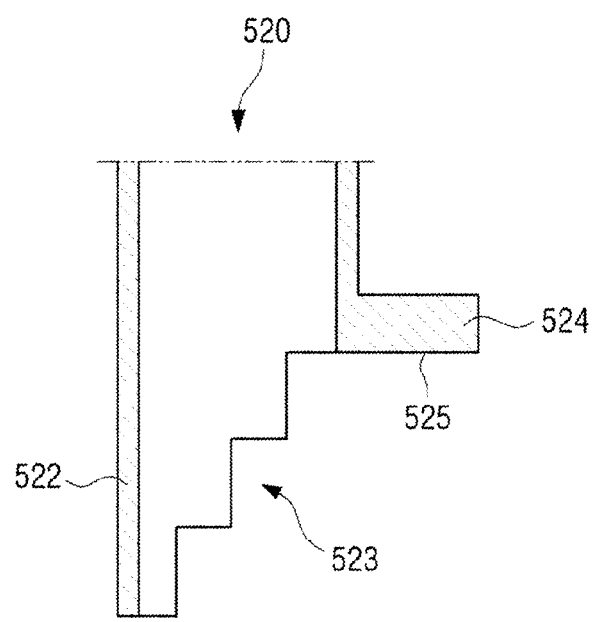
Figure 18C:
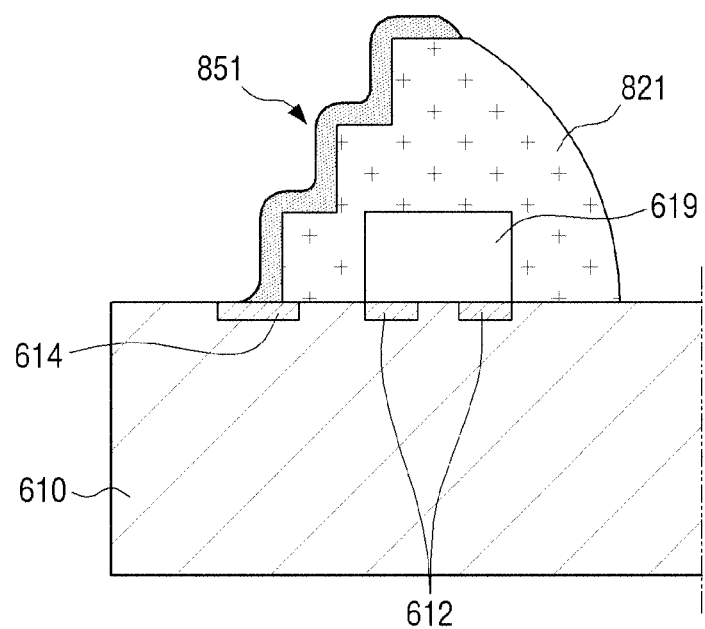

FIGS. 16A to 16C are diagrams illustrating examples of a cross-section of an insulating dam having a rounded corner, a nozzle for forming the insulating dam, and a shielding layer formed on a side surface and a portion of a top surface of the insulating dam according to an exemplary embodiment. FIGS. 17A to 17C are diagrams illustrating examples of a cross-section of an insulating dam having an inclined side surface, a nozzle for forming the insulating dam, and a shielding layer formed on the side surface and a portion of a top surface of the insulating dam according to an exemplary embodiment. FIGS. 18A to 18C are diagrams illustrating examples of a cross-section of an insulating dam having a stepped side surface, a nozzle for forming the insulating dam, and a shielding layer formed on the side surface and a portion of a top surface of the insulating dam according to an exemplary embodiment.

The shape of the side surface of the insulating dam in the EMI shielding structure according to the exemplary embodiment may be variously formed as illustrated in FIGS. 16A, 17A, and 18A. Flow of the shielding material may be controlled through the insulating dams having the various shapes so that the shielding material may not flow to a position outside of the ground pad by allowing the moving speed of the shielding material which rolls down along the side surface of the insulating dam to be reduced as compared with an insulating dam having a vertical side surface. Accordingly, the shielding material may be evenly applied to the side surface of the insulating dam.

Referring to FIG. 16A, a rounding portion 621c having a fixed curvature may be formed in a portion of an insulating dam 621 in which a side surface 621a and a top surface 621b meet. To apply a shielding material to the side surface 621a of the insulating dam 621, the shielding material discharged from a nozzle 500 may be dropped toward the rounding portion 621c in the direction indicated by an arrow. While the shielding material rolls down along the rounding portion 621c and the side surface 621a of the insulating dam 621, the shielding material may continuously cover the rounding portion 621c and the side surface 621a of the insulating dam 621 as illustrated in FIG. 16C.

Referring to FIG. 16B, a portion 506 which couples an inner end 503 of a side guide part 502 and a bottom surface 505 of a top guide part 504 in the nozzle 500 may be rounded to form the rounding portion 621c in the insulating dam 621. The top surface 621b of the insulating dam 621 may be formed to be substantially flattened by the bottom surface 505 of the top guide part 504 in the nozzle 500 similar to the top surface of the insulating surface 621 as described above.

Referring to FIG. 17A, a side surface 721a of an insulating dam 721 may be inclined at a fixed angle. To apply a shielding material to the side surface 721a of the insulating dam 721, the shielding material discharged from a nozzle 510 may roll down along the inclined side surface 721a and may be dropped toward the side surface 721a in a direction indicated by an arrow. While the shielding material rolls down along the side surface 721a of the insulating dam 721, the shielding material may cover the side surface 721a of the insulating dam 721 as illustrated in FIG. 17C.

Referring to FIG. 17B, to form the side surface 721a of the insulating dam 721 having an inclined flat surface, an inner end 513 of a side guide part 512 in the nozzle 510 may be inclined. The top surface 721b of the insulating dam 721 may be formed to be substantially flat by a bottom surface 515 of a top guide part 514 in the nozzle 510 similar to the top surface of the insulating surface 721 as described above.

Referring to FIG. 18A, an insulating dam 821 may have a step portion 821a such as a stair in a side surface. To form a first shielding part 851 in the step portion 821a, a shielding material discharged from a nozzle 520 may be dropped toward horizontal surfaces formed in the insulating step portion 821a in a direction indicated by an arrow. While the shielding material rolls down along vertical surfaces connecting with the horizontal surfaces of the step portion 821a, the shielding material may cover the insulating dam 821 as illustrated in FIG. 18C.

Referring to FIG. 18B, an inner end 523 of a side guide part 522 in the nozzle 520 may be manufactured to be stepped to form the step portion 821a in the side surface of the insulating dam 821. The top surface 821b of the insulating dam 821 may be formed to be substantially flattened by a bottom surface 525 of a top guide part 524 in the nozzle 520 similar to the top surface of the insulating dam 821 as described above.

In FIGS. 16A, 17A, 17C, 18A, and 18C, the reference numerals 610, 612, 614, and 619 refer to a PCB, a connection pad, a ground pad, and a circuit element, respectively.

Figure 19:
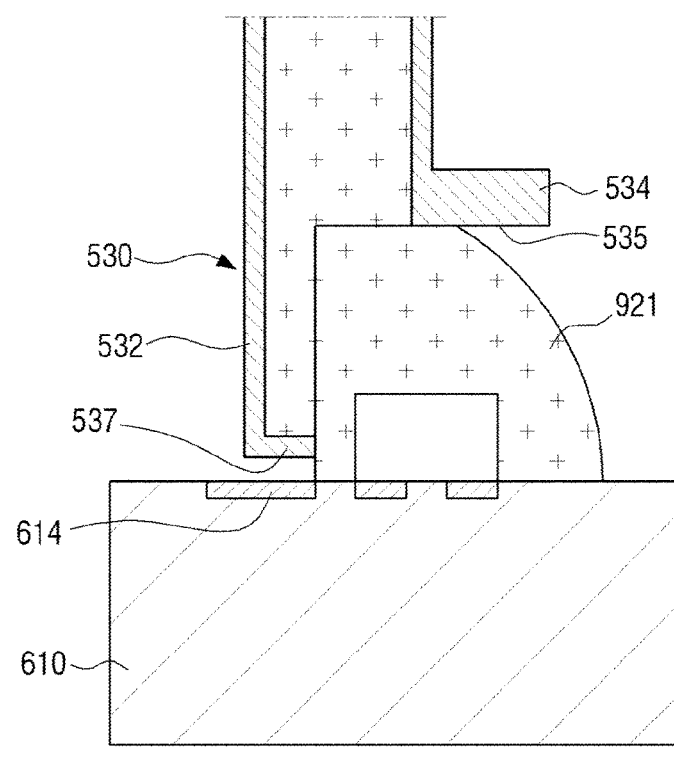
FIG. 19 is a diagram illustrating an example of a nozzle in which a portion of a lower end is closed according to an exemplary embodiment.

FIG. 19 is a diagram illustrating an example that a portion of a lower end of a nozzle is closed according to an exemplary embodiment.

Referring to FIG. 19, a blocking rib 537 may be formed in a lower end of a side guide part 532 in a nozzle 530 to form an insulating dam 921. The blocking rib 537 may block an insulating material guided to a lower side along the side guide part 532 so that the insulating material may not be discharged to the lower end of the side guide part 532. Accordingly, the ground pad 614 may not be covered with the insulating material guided along the side guide part 532 and a shielding layer formed through a subsequent process after the insulating structure is formed may be electrically coupled to the ground pad 614 formed in the PCB 610.

Figure 20:
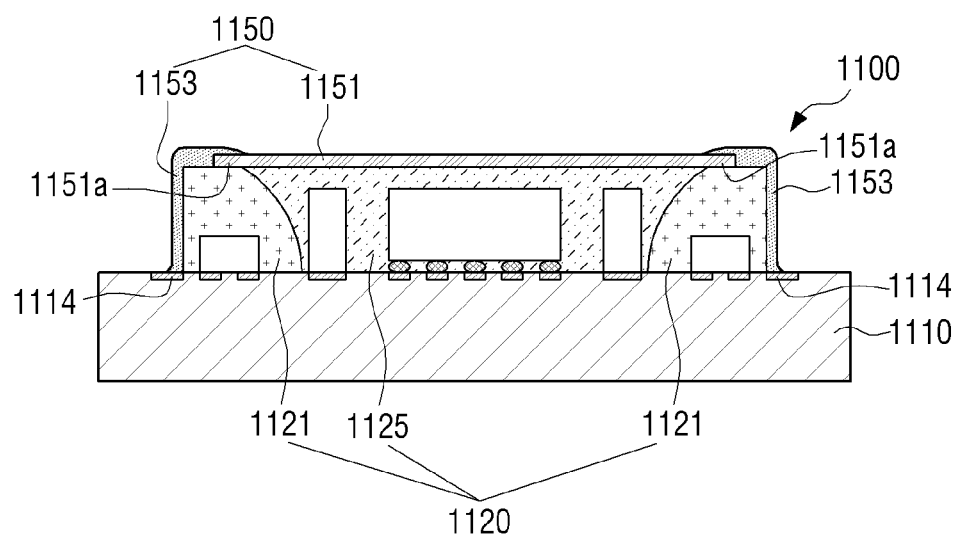
FIG. 20 is a cross-sectional diagram illustrating an EMI shielding structure according to another exemplary embodiment.

FIG. 20 is a cross-sectional diagram illustrating an EMI shielding structure according to another exemplary embodiment.

It has described in the above-described exemplary embodiments that the shielding layer is formed by discharging a shielding material having electric conductivity through a nozzle. However, embodiments are not limited thereto and a portion of a shielding layer 1150 in an EMI shielding structure 1100 may be formed of a shielding film 1151 having electric conductivity as illustrated in FIG. 20.

A process of forming an insulating structure 1120 including an insulating dam 1121 and an insulating member 1125 in the EMI shielding structure 1100 in a PCB 1110 may be the same as the above-described process of manufacturing the insulating structure 120 in the EMI shielding structure 100, but a process of forming the shielding layer 1150 performed in a subsequent process may be different from the above-described process of manufacturing the shielding layer 150 in the EMI shielding structure 100.

Referring to FIG. 20, the shielding layer 1150 may include a shielding film 1151 attached to a top surface of the insulating member 1125 and a portion of a top surface of the insulating dam 1121. The shielding layer 1150 may further include a shielding part 1153 which covers a side surface of the insulating dam 1121, the top surface of the insulating dam 1121 closed to the side surface, and an edge portion of the shielding film 1151. The shielding part 1153 may be formed by discharging a shielding material from a nozzle.

The foregoing embodiments and advantages are merely exemplary and are not to be construed as limiting the inventive concept. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. An electromagnetic interference (EMI) shielding structure comprising:
   a printed circuit board (PCB);
   a plurality of elements mounted on a region of the PCB;
   an insulating dam provided on a peripheral portion of the region of the PCB such that the plurality of elements mounted on the region of the PCB is surrounded by the insulating dam;
   an insulating member provided in an empty space surrounded by the insulating dam such that the insulating member encapsulates the plurality of elements; and
   a shielding layer covering outer surfaces of the insulating dam and the insulating member.

2. The EMI shielding structure as claimed in claim 1, wherein an outer side surface of the insulating dam is inclined.

3. The EMI shielding structure as claimed in claim 1, wherein an outer side surface of the insulating dam is stepped.

4. The EMI shielding structure as claimed in claim 1, wherein an upper corner portion of the insulating dam is rounded.

5. The EMI shielding structure as claimed in claim 1, wherein the insulating dam has a width that gradually increases from an upper end toward a lower end.

6. The EMI shielding structure as claimed in claim 1, wherein a top surface of the insulating dam is smooth, and
   a top surface of the insulating member is coplanar with the top surface of the insulating dam.

7. The EMI shielding structure as claimed in claim 1, wherein the shielding layer is formed of an electroconductive material sprayed in an atomizing form and has a predetermined thickness.

8. The EMI shielding structure as claimed in claim 1, wherein the shielding layer is formed of a shielding film.

9. The EMI shielding structure as claimed in claim 1, wherein the shielding layer comprises:
   a first portion covering an outer side surface of the insulating dam and a portion of a top surface of the insulating dam; and
   a second portion covering a remaining portion of the top surface of the insulating dam and a top surface of the insulating member.

10. The EMI shielding structure as claimed in claim 9, wherein the first portion of the shielding layer is in contact with or overlaps the second portion of the shielding layer.

* * * * *